United States Patent
Matsuhashi

(10) Patent No.: US 11,402,744 B2
(45) Date of Patent: Aug. 2, 2022

(54) PHOTOMASK BLANK, MANUFACTURING METHOD OF PHOTOMASK AND PHOTOMASK

(71) Applicant: Shin-Etsu Chemical Co., Ltd., Tokyo (JP)

(72) Inventor: Naoki Matsuhashi, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/112,839

(22) Filed: Dec. 4, 2020

(65) Prior Publication Data
US 2021/0173296 A1   Jun. 10, 2021

(30) Foreign Application Priority Data
Dec. 5, 2019  (JP) .............................. JP2019-220060

(51) Int. Cl.
*G03F 1/24* (2012.01)
*G03F 1/32* (2012.01)
(Continued)

(52) U.S. Cl.
CPC .................. *G03F 1/24* (2013.01); *G03F 1/32* (2013.01); *G03F 1/54* (2013.01); *G03F 1/58* (2013.01); *G03F 1/80* (2013.01); *H01L 21/0274* (2013.01); *H01L 21/0332* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 2001/0044054 A1* | 11/2001 | Kaneko | .................... G03F 1/50 428/432 |
| 2011/0229807 A1 | 9/2011 | Hashimoto et al. | |

(Continued)

FOREIGN PATENT DOCUMENTS

| | | |
|---|---|---|
| EP | 1152291 A2 | 7/2001 |
| EP | 3575870 A2 | 4/2019 |

(Continued)

OTHER PUBLICATIONS

Machine translation of JP 2004-053663 (2004).*

(Continued)

*Primary Examiner* — Martin J Angebranndt
(74) *Attorney, Agent, or Firm* — Ladas & Parry, LLP

(57) ABSTRACT

A photomask blank has a first layer, a second layer, a third layer and a fourth layer. The first layer has a chromium content of 40 atomic % or less, an oxygen content of 38 atomic % or more, and a nitrogen content of 22 atomic % or less. The second layer has a chromium content of 38 atomic % or less, an oxygen content of 30 atomic % or more, a nitrogen content of 18 atomic % or less, and a carbon content of 14 atomic % or less. The third layer has a chromium content of 50 atomic % or less, an oxygen content of 30 atomic % or less, and a nitrogen content of 20 atomic % or more. The fourth layer has a chromium content of 44 atomic % or less, an oxygen content of 20 atomic % or more, a nitrogen content of 20 atomic % or less, and a carbon content of 16 atomic % or less.

14 Claims, 9 Drawing Sheets

(51) Int. Cl.
*G03F 1/54* (2012.01)
*G03F 1/58* (2012.01)
*G03F 1/80* (2012.01)
*H01L 21/027* (2006.01)
*H01L 21/033* (2006.01)

(56) References Cited

U.S. PATENT DOCUMENTS

| | | | |
|---|---|---|---|
| 2015/0160549 A1* | 6/2015 | Sasamoto | G03F 1/54 |
| | | | 430/5 |
| 2017/0168384 A1* | 6/2017 | Shishido | G03F 1/80 |
| 2018/0088456 A1* | 3/2018 | Kosaka | C23C 14/0094 |
| 2018/0267398 A1* | 9/2018 | Irie | G03F 1/58 |
| 2019/0163047 A1 | 5/2019 | Kajiwara et al. | |

FOREIGN PATENT DOCUMENTS

| | | | |
|---|---|---|---|
| JP | 2983020 B1 | | 11/1999 |
| JP | 2000181049 A | | 6/2000 |
| JP | 2004-053663 | * | 2/2004 |
| JP | 2014197215 A | | 10/2014 |
| WO | 2009/123167 | * | 12/2009 |

OTHER PUBLICATIONS

Machine translation of WO 2009/123167 (2009).*
Extended European Search Report from EP app. No. 20210679.5, dated Apr. 29, 2021.

* cited by examiner

PHOTOMASK BLANK, MANUFACTURING METHOD OF PHOTOMASK AND PHOTOMASK

TECHNICAL FIELD

The present invention relates to a photomask blank used in the manufacture of a semiconductor device and the like, a method of manufacturing a photomask using the same, and a photomask.

The present application claims the priority of Japanese Patent Application No. 2019-220060 filed on Dec. 5, 2019, the contents of which are entirely incorporated by reference.

RELATED ART

In recent years, with the miniaturization of semiconductor devices, particularly due to the high integration of large-scale integrated circuits, high pattern resolution is required for projection exposure. Therefore, in the photomask, a phase shift mask has been developed as a method of improving the resolution of the transfer pattern. In the principle of the phase shift method, by adjusting the phase of the transmitted light that has passed through the opening of the photomask so that it is inverted by about 180 degrees with respect to the phase of the transmitted light that has passed through the portion adjacent to the opening, the light intensity at the boundary is weakened when the transmitted light interferes with each other, and as a result, the resolution and depth of focus of the transfer pattern is improved. The photomask using this principle is generally called a phase shift mask.

The phase shift mask blank used for the phase shift mask has most generally a structure in which a phase shift film is laminated on a transparent substrate such as a glass substrate, and a film containing chromium (Cr) is laminated on the phase shift film. The phase shift film is mainly formed of a film containing molybdenum (Mo) and silicon (Si), having a phase difference of 175 to 185 degrees and a transmittance of about 6 to 30% with respect to the exposure light. Further, generally, a chromium-containing film is adjusted to have a film thickness having a desired optical density together with the phase shift film, and the chromium-containing film is used as a light-shielding film and as a hard mask film for etching the phase shift film.

In a method of forming a phase shift mask pattern from this phase shift mask blank, more specifically, a resist film is formed on the chromium-containing film of the phase shift mask blank, a pattern is drawn on this resist film by light or electron beam, which is developed to form a resist pattern, and a pattern is formed by etching the chromium-containing film with this resist pattern as an etching mask. Further, the phase shift film is etched with the pattern of the chromium-containing film as an etching mask to form the phase shift film pattern, and then the resist pattern and the pattern of the chromium-containing film are removed.

Here, the light-shielding film is left outside the portion where the circuit pattern of the phase shift film pattern is formed, and becomes a light-shielding part (light-shielding film pattern) on the outer peripheral edge part of the phase shift mask so that the combined optical density of the phase shift film and the light-shielding film is 3 or more. This is to prevent unnecessary exposure light from leaking and irradiating the resist film on the adjacent chip located outside the circuit pattern when the circuit pattern is transferred to the wafer using the wafer exposure apparatus. A method of forming such a light-shielding film pattern generally includes forming a phase shift film pattern, newly forming a resist film, after removing the resist pattern, etching a chromium-containing film with the resist pattern formed by pattern drawing and development as an etching mask, and forming a light-shielding film pattern of the outer peripheral edge part.

In a phase shift mask that requires highly accurate pattern formation, dry etching using gas plasma is mainly used. For dry etching of a chromium-containing film, dry etching using oxygen-containing chlorine-based gas (chlorine-based dry etching) is used, and for dry etching of a film containing molybdenum and silicon, dry etching using a fluorine-based gas (fluorine-based dry etching) is used. In particular, in dry etching of a chromium-containing film, it is known that by making an etching gas that is a mixture of oxygen gas of 10 to 25% by volume with respect to chlorine-based gas, the chemical reaction is heightened to improve the etching rate.

As the circuit pattern is finer, a technique for forming finely the phase shift mask pattern is also required. Specifically, the assist pattern of the line pattern, which assists the resolution of the main pattern of the phase shift mask, is required to be formed smaller than the main pattern to prevent the transfer to the wafer when the circuit pattern is transferred to the wafer using the wafer exposure apparatus. In the phase shift mask of the generation in which the pitch of the line and space pattern of the circuit on the wafer is 10 nm, the line width of the assist pattern of the line pattern on the phase shift mask is required to be about 40 nm.

The chemically amplified resist for forming a fine pattern is composed of a base resin, an acid generator, a surfactant, etc. Since many reactions in which the acid generated by exposure acts as a catalyst can be applied, high sensitivity is possible, and it is possible to form the mask pattern such as the fine phase shift mask pattern with a line width of 0.2 μm or less using the chemically amplified resist. However, in the chemically amplified resist, when the pattern width is narrowed, the fine pattern collapses due to the collision of the developer in the development process to reach the resolution limit.

For example, in the method described in JP 2014-197215 A, in order to form a fine assist pattern, thinning of the resist film, reduces the collapse of fine patterns in the development process, and in this method, carbon is added to a chromium-containing film, which is an etching mask film to obtain a film having a high etching rate. In etching using a resist film, during the etching of the chromium-containing film, the resist film as well as the chromium-containing film is etched. Since if the resist film disappears during etching of the chromium-containing film, pinholes are generated on the surface layer of the chromium-containing film, it is necessary that a sufficient resist film remains after etching the chromium-containing film. Since the method described in JP 2014-197215 A has a high etching rate for a chromium-containing film, the etching of the chromium-containing film is completed relatively quickly, so that the resist film can be thinned.

SUMMARY

The cause of deteriorating the resolution of the photomask comes from a problem caused by the chrome film in addition to the above. In the dry etching process of the chrome film, side etching occurs from the vicinity of the center of the isolated line pattern in the thickness direction toward the substrate, resulting in that a pattern is produced in which the line width from the vicinity of the center of the pattern toward the substrate is thin and the line width of the upper layer of the pattern is thick. As a result, part of the chrome film is dissociated, which does not function as a mask when dry etching the film containing molybdenum and silicon in the lower layer, thereby worsening the resolution limit. When the line width of the isolated line pattern on the photomask is smaller than 50 nm, the dissociation of the chrome film in the dry etching process of the chrome film in addition to the pattern collapse in the development process is a problem. In addition, when removing the resist remaining on the chrome film after dry etching of the chrome film, the resist removal and cleaning is performed. At this time, in the case of a pattern in which the line width is narrow from the vicinity of the center of the pattern of the chrome film toward the substrate and the line width in the upper layer of the pattern is thick as described above, the impact of the cleaning liquid makes it easier for the pattern to collapse, worsening the resolution limit.

For example, in the method described in JP 2014-197215 A described above, the film thickness of the chromium-containing film is formed as thin as 20 nm or less, in addition, the composition of the chrome film is oxide carbonized chromium nitride to improve the etching rate, the dry etching of the chrome film finishes early, and the loss of resist film due to etching can be reduced. Although this makes it possible to make the resist film thinner, due to the inclusion of carbon and nitrogen in the chrome film, large side etching occurs in the vicinity of the center of the isolated line pattern. It has been found that as a result, part of the chrome film is dissociated during the dry etching of the chrome film, which does not function as a mask when etching the lower phase shift film, so that the sufficient assist pattern resolution cannot be obtained.

In addition, in the method described in Japanese Patent No. 2983020, a film made of a chromium-containing material as a metal film laminated on the phase shift film is made to change its composition toward a transparent substrate in the thickness direction, and a structure in which the etching rate increases stepwise or continuously from the surface of the metal film toward the transparent substrate makes it possible to prevent metal residue of the metal film on the phase shift film. In this case, the metal film can have a multi-layer structure, and a structure having a layer having a high etching rate under the thin outermost layer in contact with the resist film can be employed. In this case, the resist film can be formed to be thin. However, in this way, since nitrogen contained in the metal film is a component that accelerates the etching rate, the metal film contains nitrogen to increase the dry etching rate. With such a metal film, when a resist is applied on a chromium-containing film, oxygen in the chromium-containing film, which contributes to adhesion to the resist film, is not sufficiently supplied to the interface between the chromium-containing film and the resist film, so that sufficient assist pattern resolution cannot be obtained.

Also, it has been found that in this case, the etching rate is increased by nitrogen, side etching is generated, part of the chrome film in the isolated pattern is dissociated, which does not function as a mask when etching the lower phase shift film, so that the sufficient assist pattern resolution could not be obtained.

The present invention has been made to solve the problems, it is an object of the present invention to provide a photomask blank capable of achieving a good resolution limit, a method of manufacturing a photomask using the same, and the photomask in the formation of a line pattern assist pattern in which when dry etching the chrome film, large side etching does not occur for isolated line patterns, and part of the chrome film is not dissociated, so that the resolution did not deteriorate through the dry etching process and the subsequent resist removal and cleaning process, and in addition, the resist film has high adhesion to the chromium-containing film, the resolution of the isolated line pattern does not deteriorate through the development process, and the resolution of the main pattern of a photomask such as a phase shift mask is assisted.

In order to solve the problems, the inventors has diligently studied a photomask blank including a substrate such as a transparent substrate, a film made of a chromium-containing material, a film to be processed which is formed in contact with the substrate side of the film made of the chromium-containing material, and on which a pattern of the film made of the chromium-containing material is processed as an etching mask. As a result of consideration, it has been found that the adhesion of the resist film to the chromium-containing film is good in the oxygen-rich oxygen-nitrogen-containing film, further, instead of using a chromium oxynitride carbide film, which is a light-shielding film, having a high dry etching rate as a single layer, by inserting a chromium oxynitride film with a slow etching rate in therebetween, a three-layer structure consisting of a chromium oxynitride carbide film, a chromium oxynitride film, and a chromium oxynitride carbide film is formed in order from a side away from the substrate, so that in the etching process, side etching is suppressed and a rectangular pattern shape can be obtained from the vicinity of the center of the isolated line pattern in the thickness direction toward the substrate. It has been found that it is effective that the film made of the chromium-containing material is a four-layer laminated film consisting of a first layer, a second layer, a third layer, and a fourth layer in order from a side away from the substrate, wherein the first layer, the second layer, the third layer, and the fourth layer all contain three or more kinds of elements of chromium, oxygen, nitrogen, and carbon, wherein the first layer has a chromium content of 40 atomic % or less, an oxygen content of 38 atomic % or more, and a nitrogen content of 22 atomic % or less, and a thickness of 6 nm or less, wherein the second layer has a chromium content of 38 atomic % or less, an oxygen content of 30 atomic % or more, a nitrogen content of 18 atomic % or less, and a carbon content of 14 atomic % or less, and a film thickness of 22 nm or more and 32 nm or less, wherein the third layer has a chromium content of 50 atomic % or less, an oxygen content of 30 atomic % or less, and a nitrogen content of 20 atomic % or more, and a film thickness of 6 nm or less, and wherein the fourth layer has a chromium content of 44 atomic % or less, an oxygen content of 20 atomic % or more, a nitrogen content of 20 atomic % or less, and a carbon content of 16 atomic % or less, and a film thickness of 13 nm or more.

It has been found that is such a photomask blank, for example, in a phase shift mask blank in which a phase shift film, which is a film made of a silicon-containing material, is formed, and in a reflective mask blank in which an absorption film, which is a film made of a tantalum-containing material, is formed, as a film to be processed, the resist film has high adhesion to the chromium-containing film, and the side etching generated from the vicinity of the center of the isolated line pattern in the thickness direction toward the substrate is suppressed during the dry etching of the chromium-containing film, so that part of the micro-isolated line pattern is prevented from disappearing, and even when a photomask is manufactured by the general method of manufacturing photomasks, a good resolution limit can be achieved in the formation of the assist pattern of the line pattern that assists the resolution of the main pattern of the photomask, thereby making the present invention.

Therefore, the present invention provides, as an example, a photomask blank, a method of manufacturing a photomask, and a photomask as shown below.

[Concept 1]

A photomask blank may comprise:

a substrate;

a film made of a chromium-containing material; and a film to be processed that is provided between the film made of the chromium-containing material and the substrate, and that is to be processed by using a pattern of the film made of the chromium-containing material as an etching mask, wherein the film made of the chromium-containing material may have a first layer, a second layer, a third layer, and a fourth layer in order from a side away from the substrate, each of the first layer, the second layer, the third layer, and the fourth layer may contain three or more kinds of elements of chromium, oxygen, nitrogen, and carbon, the first layer may have a chromium content of 40 atomic % or less, an oxygen content of 38 atomic % or more, and a nitrogen content of 22 atomic % or less, and a thickness of 6 nm or less, the second layer may have a chromium content of 38 atomic % or less, an oxygen content of 30 atomic % or more, a nitrogen content of 18 atomic % or less, and a carbon content of 14 atomic % or less, and a film thickness of 22 nm or more and 32 nm or less, the third layer may have a chromium content of 50 atomic % or less, an oxygen content of 30 atomic % or less, and a nitrogen content of 20 atomic % or more, and a film thickness of 6 nm or less, and the fourth layer may have a chromium content of 44 atomic % or less, an oxygen content of 20 atomic % or more, a nitrogen content of 20 atomic % or less, and a carbon content of 16 atomic % or less, and a film thickness of 13 nm or more.

[Concept 2]

In the photomask blank according to concept 1, the film to be processed may be a film made of a silicon-containing material.

[Concept 3]

In the photomask blank according to concept 2, the film made of the chromium-containing material may be a light-shielding film, the film made of the silicon-containing material may be a phase shift film, and the photomask blank may be a phase shift mask blank in which a combined optical density of the light-shielding film and the phase shift film with respect to exposure light is 3 or more.

[Concept 4]

In the photomask blank according to concept 3, the film made of the chromium-containing material may have a film thickness of 39 nm or more and 94 nm or less.

[Concept 5]

In the photomask blank according to concept 3 or 4, the phase shift film may have a phase difference of 175 degrees or more and 185 degrees or less with respect to the exposure light, a transmittance of 6% or more and 30% or less, and a film thickness of 60 nm or more and 85 nm or less.

[Concept 6]

In the photomask blank according to concept 1, the film to be processed may have a film made of a tantalum-containing material.

[Concept 7]

In the photomask blank according to concept 6, the film made of the tantalum-containing material may be an absorption film for extreme ultraviolet region light, the film to be processed may have a reflective film for the extreme ultraviolet region light provided between the absorption film and the substrate, and the photomask blank may be a reflective mask blank.

[Concept 8]

The photomask blank according to any one of concepts 1 to 7, may further comprise a resist film provided on a side, which is away from the substrate, of the film made of the chromium-containing material, the resist film having a film thickness of 50 nm or more and 200 nm or less.

[Concept 9]

A method of manufacturing a photomask having a circuit pattern of a film made of a silicon-containing material from the photomask blank according to concept 2, may comprise steps of:

(A) forming a resist film on a side, which is away from the substrate, of the film made of the chromium-containing material;

(C) patterning the resist film to form a resist pattern;

(D) patterning the film made of the chromium-containing material to form a pattern of the film made of the chromium-containing material by dry etching using an oxygen-containing chlorine-based gas with the resist pattern as an etching mask;

(E) patterning a film made of a silicon-containing material to form a pattern of the film made of the silicon-containing material by dry etching using a fluorine-based gas with the pattern of the film made of the chromium-containing material as an etching mask; and (F) after step (E), leaving the film made of the chromium-containing material at a portion, located at an outer peripheral edge part of the substrate, where the circuit pattern is not formed, and removing the pattern of the film made of the chromium-containing material in other than the outer peripheral edge part by dry etching using an oxygen-containing chlorine-based gas.

[Concept 10]

the method of manufacturing according to concept 9, may further comprise:

after step (A) and before step (C), (B) removing the resist film using a mixture of sulfuric acid and hydrogen peroxide solution, and newly forming a resist film on a side, which is away from the substrate, of the film made of the chromium-containing material.

[Concept 11]

A photomask may comprise:

a substrate; and a film to be processed provided on the substrate and having an effective region including a circuit pattern, wherein a film made of a chromium-containing material may be provided on the film to be processed at an outer peripheral edge part located outside a peripheral edge of the effective region, and the film made of the chromium-containing material has a first layer, a second layer, a third layer, and a fourth layer in order from a side away from the substrate, each of the first layer, the second layer, the third layer, and the fourth layer may contain three or more kinds of elements of chromium, oxygen, nitrogen, and carbon, the first layer may have a chromium content of 40 atomic % or less, an oxygen content of 38 atomic % or more, and a nitrogen content of 22 atomic % or less, and a thickness of 6 nm or less, the second layer may have a chromium content of 38 atomic % or less, an oxygen content of 30 atomic % or more, a nitrogen content of 18 atomic % or less, and a carbon content of 14 atomic % or less, and a film thickness of 22 nm or more and 32 nm or less, the third layer may have a chromium content of 50 atomic % or less, an oxygen content of 30 atomic % or less, and a nitrogen content of 20 atomic % or more, and a film thickness of 6 nm or less, and the fourth layer may have a chromium content of 44 atomic % or less, an oxygen content of 20 atomic % or more, a nitrogen content of 20 atomic % or less, and a carbon content of 16 atomic % or less, and a film thickness of 13 nm or more.

[Concept 12]

In the photomask according to concept 11, the film to be processed may be a film made of a silicon-containing material, the film made of the chromium-containing material may be a light-shielding film, the film made of the silicon-containing material may be a phase shift film, and the photomask may be a phase shift mask in which a combined optical density of the light-shielding film and the phase shift film with respect to exposure light is 3 or more.

[Concept 13]

In the photomask according to concept 12, the film made of the chromium-containing material may have a film thickness of 39 nm or more and 94 nm or less.

[Concept 14]

In the photomask according to concept 12 or 13, the phase shift film may have a phase difference of 175 degrees or more and 185 degrees or less with respect to the exposure light, a transmittance of 6% or more and 30% or less, and a film thickness of 60 nm or more and 85 nm or less.

The photomask blank of the present invention has high adhesion of the resist film to the chromium-containing film, and even when no special development process or special dry etching process is used, and the photomask is manufactured by the general method of manufacturing a photomask, it is possible to prevent the fine line pattern from collapsing due to collision of the developer in the development process. Furthermore, in the dry etching process of dry etching the chromium-containing film, a rectangular isolated line pattern can be formed by preventing large side etching from appearing from the vicinity of the center of the isolated line pattern in the thickness direction toward the substrate, and by preventing part of the chromium-containing film from disappearing due to the unstable pattern shape in the dry etching process, a good resolution limit can be achieved in the formation of the assist pattern of the line pattern, which assists the resolution of the main pattern of the photomask.

DETAILED DESCRIPTION

Figure 1:
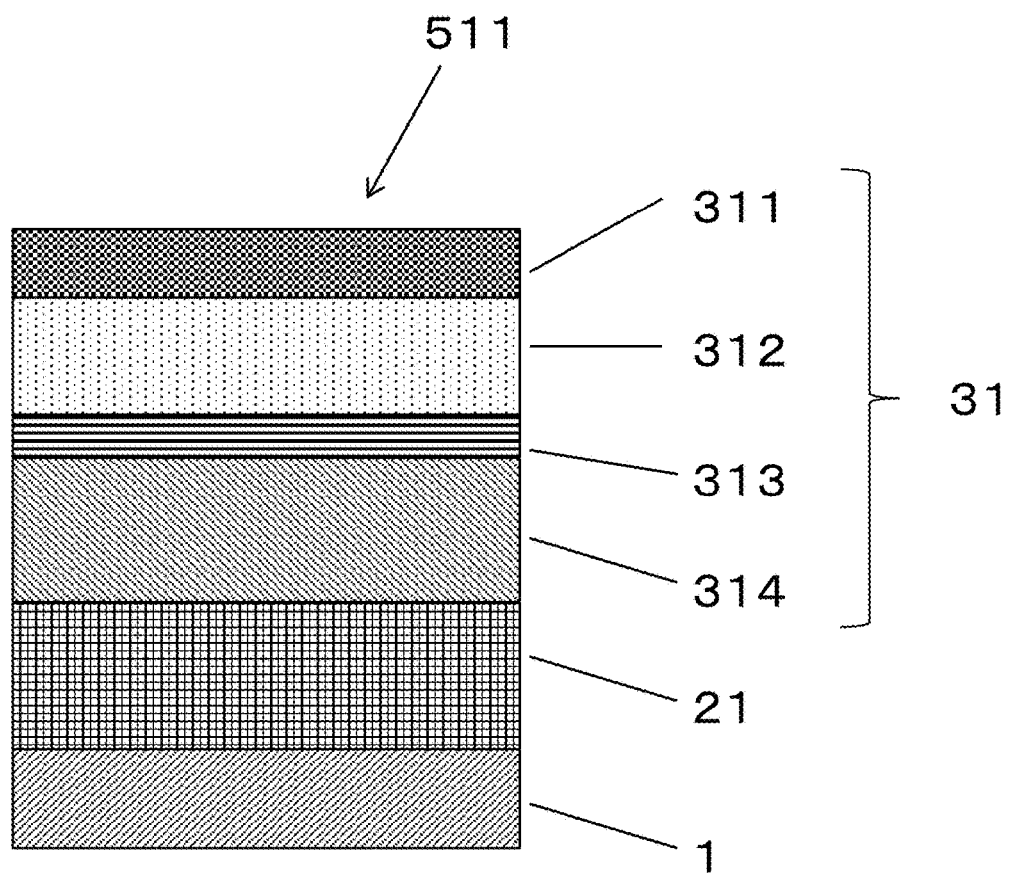
FIG. 1 is a cross-sectional view showing an example of a first aspect (phase shift mask blank) of a photomask blank of the present invention.

Hereinafter, the present embodiment will be described.

The photomask blank of the present embodiment has, as an example, a substrate, a film made of a chromium-containing material, and a film to be processed which is formed in contact with the substrate side of the film made of the chromium-containing material and on which a pattern of the film made of the chromium-containing material is processed as an etching mask. That is, the photomask blank of the present embodiment has a film to be processed and a film made of a chromium-containing material on the substrate in order from the substrate side. The film made of the chromium-containing material is formed in contact with the film to be processed. In the present embodiment, the film made of the chromium-containing material is a four-layer laminated film consisting of a first layer, a second layer, a third layer, and a fourth layer in order from a side away from the substrate. The film made of the chromium-containing material may be composed of four or more layers, and may be composed of, for example, five layers or six layers.

From the photomask blank of the present embodiment, a photomask having a circuit pattern of a film to be processed, such as a film made of a silicon-containing material and a film made of a tantalum-containing material, can be manufactured on a substrate. Specifically, from this photomask blank, it is possible to manufacture a photomask in which a film made of a chromium-containing material is formed in contact with a film made of a silicon-containing material at a portion, located at the outer peripheral edge part of the substrate, which is a region where a circuit pattern is not formed (that is, outside the region where the circuit pattern is formed (effective region)) of the film made of the silicon-containing material on the photomask.

For the substrate, the type of substrate and the size of the substrate are not particularly limited, and the reflective photomask blank and the reflective photomask do not necessarily have to be transparent at the wavelength used as the exposure wavelength. For the transmissive photomask blank and the transmissive photomask, a transparent substrate such as a quartz substrate, which is transparent at the wavelength used as the exposure wavelength, is applied, and for example, a substrate called a 6-inch square, 0.25-inch thick 6025 substrate specified in the SEMI standard is suitable. When the SI unit system is used, the 6025 substrate is usually described as a 152 mm square substrate with a thickness of 6.35 mm.

When the film to be processed is a film made of a silicon-containing material, as a film made of a silicon-containing material, optical films such as a light-shielding film, an anti-reflection film, and a phase shift film such as a halftone phase shift film used for a transmissive photomask are suitable.

When the film made of the silicon-containing material is a phase shift film (for example, a halftone phase shift film), the photomask blank is a phase shift mask blank (halftone phase shift mask blank), and a phase shift mask (for example, a halftone phase shift mask) is manufactured from the phase shift mask blank.

From this phase shift mask blank, it is possible to manufacture a phase shift mask having a pattern of a phase shift film including a circuit pattern (photomask pattern) on a transparent substrate. Further, from this phase shift mask blank, it is possible to manufacture a phase shift mask in which a film made of a chromium-containing material is formed in contact with a phase shift film at a portion, located at the outer peripheral edge part of a transparent substrate, which is a region, where a circuit pattern is not formed, of the phase shift films on the phase shift mask. The film made of the chromium-containing material is preferably a light-shielding film, and when manufacturing a phase shift mask from a phase shift mask blank, part of the hard mask film used as the etching mask in the etching of the phase shift film can be left as a light-shielding film.

The phase difference of the phase shift film with respect to the exposure light is preferably 175 degrees or more and 185 degrees or less. The transmittance of the phase shift film with respect to the exposure light is preferably 6% or more and 30% or less, which is highly effective in the resolution of the transfer pattern and the depth of focus due to the phase shift effect according to the exposure condition. The film thickness of the phase shift film is preferably 60 nm or more and 85 nm or less from the viewpoint of keeping the phase difference and the transmittance within a predetermined range.

Hereinafter, the structure of the photomask blank and the photomask, and the method of manufacturing the photomask from the photomask blank according to the embodiment of the present embodiment will be described with reference to the drawings. The same components may be designated by the same reference numerals and duplicate descriptions may be omitted. In addition, the drawings may be expanded for convenience, and the dimensional ratios of the respective components are not necessarily the same as the actual ones.

FIG. 1 is a cross-sectional view showing an example of a first aspect of the photomask blank of the present embodiment. This photomask blank is a phase shift mask blank. A phase shift mask blank 511 has a phase shift film (film to be processed) 21 that is formed in contact with a transparent substrate 1 on the transparent substrate 1 and that is a film made of a silicon-containing material, and a hard mask film 31 which is formed in contact with the phase shift film 21, and that is a film made of a chromium-containing material. The hard mask film 31 is composed of a first layer 311, a second layer 312, a third layer 313, and a fourth layer 314 in order from a side away from the transparent substrate 1.

Figure 2:
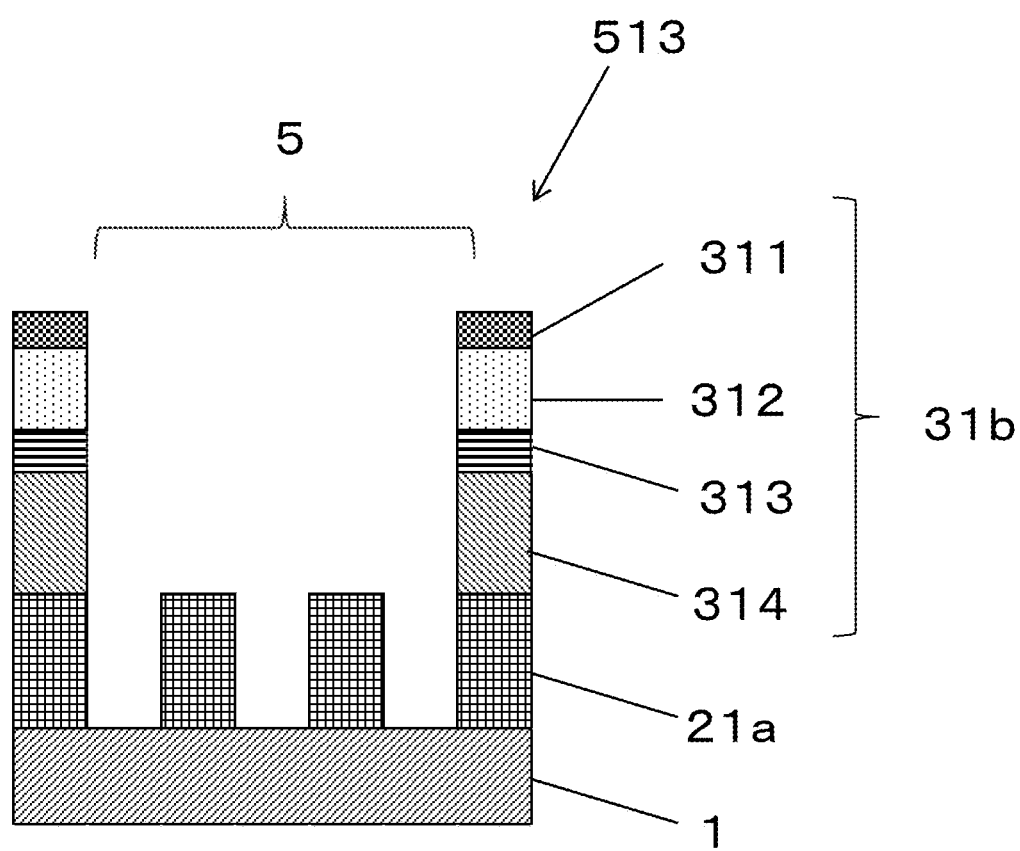
FIG. 2 is a cross-sectional view showing an example of the first aspect (phase shift mask) of a photomask of the present invention.

FIG. 2 is a cross-sectional view showing an example of the first aspect of the photomask of the present embodiment. This photomask is a phase shift mask. A phase shift mask 513 has a phase shift film pattern 21a that is formed on the transparent substrate 1 in contact with the transparent substrate 1, and which is a film made of a silicon-containing material, and a light-shielding film pattern 31b that is formed in contact with the phase shift film pattern 21a at a portion, located at the outer peripheral edge part of the transparent substrate 1, which is a region where a circuit pattern is not formed, and that is a film made of a chromium-containing material, and a circuit pattern is formed in an effective region 5. The light-shielding film pattern 31b is composed of the first layer 311, the second layer 312, the third layer 313, and the fourth layer 314 in order from a side away from the transparent substrate 1. The phase shift mask 513 shown in FIG. 2 can be manufactured from the phase shift mask blank 511 shown in FIG. 1.

The film made of the silicon-containing material may be a single-layer film or a multilayer film (for example, a film composed of 2 to 4 layers), and may be a film having a gradient composition. The silicon-containing material is preferably a material that is resistant to chlorine-based dry etching and can be removed by fluorine-based dry etching. In the present embodiment, an example of fluorine-based dry etching includes typically dry etching with a fluorine-containing etching gas such as $CF_4$ gas or $SF_6$ gas, and an example of chlorine-based dry etching includes typically dry etching with a chlorine- and oxygen-containing etching gas such as a mixed gas with $Cl_2$ gas and $O_2$ gas. The silicon-containing material is preferably a material containing silicon and not containing a transition metal, or a material containing a transition metal (Me) other than chromium and silicon, and not containing chromium.

The material of the film containing silicon and not containing the transition metal may be silicon alone (Si), or any silicon compound containing silicon (Si) and one or more selected from oxygen (O), nitrogen (N) and carbon (C). Examples of the material include a material made of silicon (Si), a material made of silicon and oxygen (SiO), a material made of silicon and nitrogen (SiN), a material made of silicon, oxygen and nitrogen (SiON), a material made of silicon and carbon (SiC), a material made of silicon, oxygen and carbon (SiOC), a material made of silicon, nitrogen and carbon (SiNC), a material made of silicon, oxygen, nitrogen and carbon (SiONC).

On the other hand, a material of a film containing transition metals (Me) other than chromium and silicon, and not containing chromium may be a transition metal (Me) silicon compound containing a transition metal (Me) and silicon (Si), or a transition metal (Me) silicon compound containing a transition metal (Me), silicon (Si), and one or more selected from oxygen (O), nitrogen (N) and carbon (C).

Examples of the material include a material made of a transition metal and silicon (MeSi), a material made of a transition metal, silicon, and oxygen (MeSiO), a material made of a transition metal, silicon, and nitrogen (MeSiN), a material made of a transition metal, silicon, oxygen, and nitrogen (MeSiON), a material made of a transition metal, silicon, and carbon (MeSiC), a material made of a transition metal, silicon, oxygen, and carbon (MeSiOC), a material made of a transition metal, silicon, nitrogen, and carbon (MeSiNC), and a material made of a transition metal, silicon, oxygen, nitrogen, and carbon (MeSiONC).

Here, as the transition metal (Me) other than chromium, one or more selected from molybdenum (Mo), tungsten (W), tantalum (Ta), titanium (Ti), zirconium (Zr) and hafnium (Hf) are suitable, and in particular, molybdenum (Mo) is preferable from the viewpoint of dry etching workability. The material of the film made of the silicon-containing material may contain hydrogen or the like.

On the other hand, when the film to be processed is a film made of a tantalum-containing material, an optical film such as an absorption film used for a reflective photomask is suitable as the film made of the tantalum-containing material. In this case, the reflective photomask blank and the reflective photomask have a reflective film formed in contact with the substrate side of the absorption film. In this case, the absorption film and the reflective film can be an absorption film for extreme ultraviolet region light and a reflective film for extreme ultraviolet region light, respectively. The wavelength of light in the extreme ultraviolet region is usually 13 to 14 nm. Further, the reflective film is preferably a multilayer reflective film composed of a plurality of layers.

When the film made of the tantalum-containing material is an absorption film, the photomask blank is a reflective photomask blank (reflective mask blank), and a reflective photomask (reflective mask) is manufactured from the reflective photomask blank.

A reflective mask having an absorption film pattern including a circuit pattern (photomask pattern) can be manufactured on the substrate from the reflective mask blank. The film thickness of the absorption film is preferably 50 nm or more, particularly preferably 60 nm or more, and preferably 110 nm or less, particularly preferably 100 nm or less. On the other hand, the film thickness of the reflective film is preferably 200 nm or more, particularly preferably 220 nm or more, and preferably 340 nm or less, particularly preferably 280 nm or less.

Figure 3:
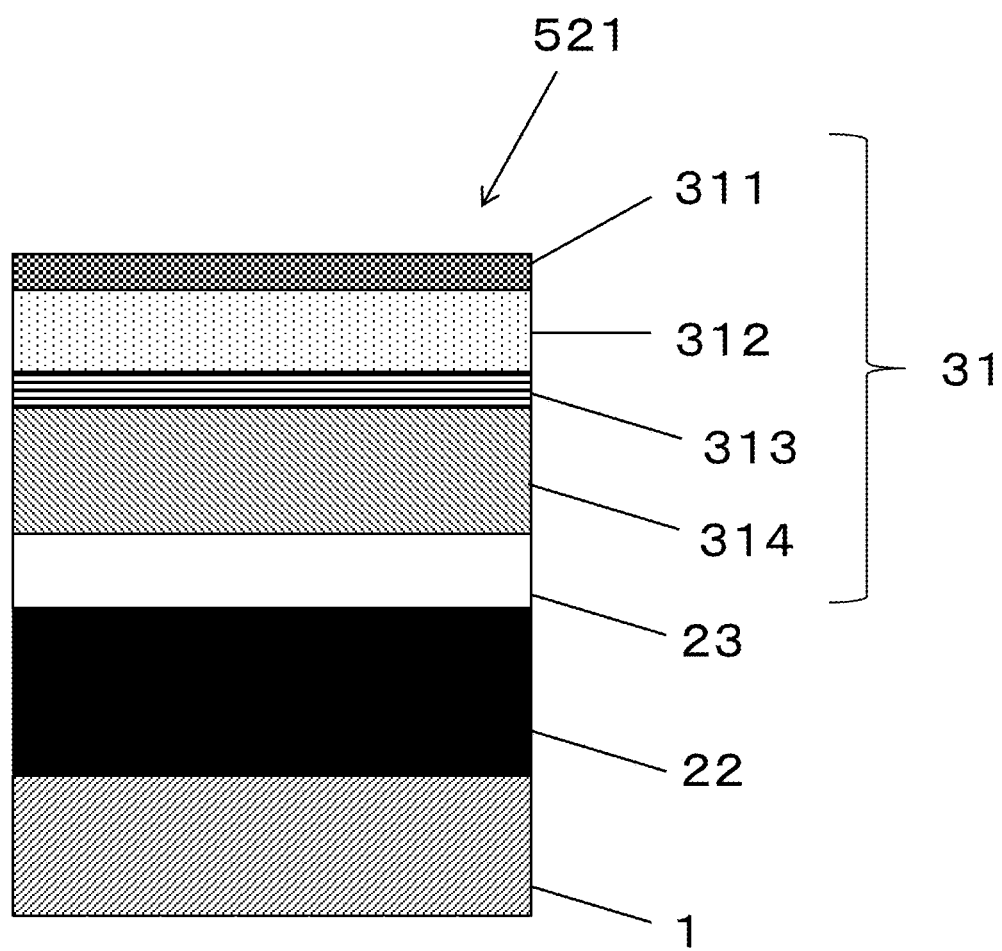
FIG. 3 is a cross-sectional view showing an example of a second aspect (reflective mask blank) of the photomask blank of the present invention.

FIG. 3 is a cross-sectional view showing an example of a second aspect of the photomask blank of the present embodiment. This photomask blank is a reflective mask blank. A reflective mask blank 521 has a reflective film 22 formed on the substrate 1 in contact with the substrate 1, an absorption film (film to be processed) 23 which is formed in contact with the reflective film 22, and that is a film made of a tantalum-containing material, and the hard mask film 31 which is formed in contact with the absorption film 23, and that is a film made of a chromium-containing material. Further, the hard mask film 31 is composed of the first layer 311, the second layer 312, the third layer 313, and the fourth layer 314 in order from a side away from the substrate 1.

Figure 4:
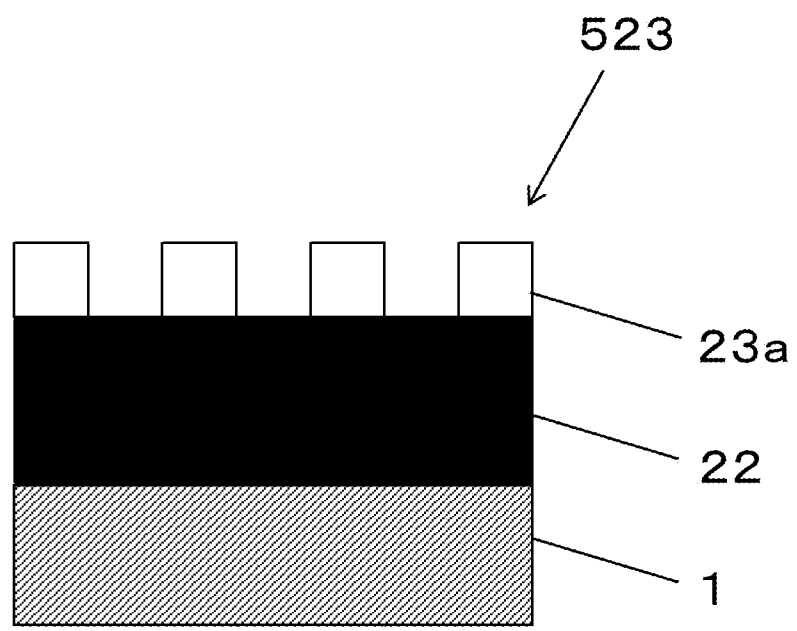
FIG. 4 is a cross-sectional view showing an example of the second aspect (reflective mask) of the photomask of the present invention.

FIG. 4 is a cross-sectional view showing an example of the second aspect of the photomask of the present embodiment. This photomask is a reflective mask. A reflective mask 523 has the reflective film 22 formed on the substrate 1 in contact with the substrate 1 and absorption film pattern 23a which is formed in contact with the reflective film 22, and that is a film made of a tantalum-containing material. The reflective mask 523 shown in FIG. 4 can be manufactured from the reflective mask blank 521 shown in FIG. 3.

The film made of the tantalum-containing material may be a single-layer film or a multilayer film (for example, a film composed of 2 to 4 layers), and may be a film having a gradient composition. The tantalum-containing material is preferably a material that can be removed by the dry etching using only a chlorine-based gas (for example, $Cl_2$ gas) or a mixed gas of a chlorine-based gas (for example, $Cl_2$ gas) and a fluorine-based gas (for example, $CF_4$ gas or $SF_6$ gas) as the etching gas. Examples of the tantalum-containing material include tantalum alone (Ta) or the tantalum compound containing tantalum (Ta) and one or more selected from oxygen (O), nitrogen (N), boron (B) and the like. Examples of the material include a material made of tantalum (Ta), a material made of tantalum and oxygen (TaO), a material made of tantalum and nitrogen (TaN), a material made of tantalum and boron (TaB), a material made of tantalum, boron and oxygen (TaBO), and a material made of tantalum, boron and nitrogen (TaBN).

On the other hand, the material of the reflective film is preferably a material that is resistant to chlorine-based dry etching and can be removed by fluorine-based dry etching. Examples of the material of the reflective film include molybdenum (Mo) and silicon (Si), and generally, a multilayer film in which about 20 to 60 layers of molybdenum layers and silicon layers are alternately laminated. Further, a protective film for protecting the reflective film may be formed between the reflective film and the absorption film. The film thickness of the protective film is preferably 2 nm or more and 20 nm or less. An example of the material of the protective film includes ruthenium (Ru).

In the present embodiment, the film made of the chromium-containing material is a four-layer laminated film composed of a first layer, a second layer, a third layer, and a fourth layer in order from a side away from the substrate, and of the first layer, the second layer, the third layer and the fourth layer, the first layer and the third layer may be made of a chromium-, oxygen- and nitrogen-containing material, and the second layer and the fourth layer may be made of a chromium-, oxygen-, nitrogen- and carbon-containing material. The chromium-containing material is preferably a material that is resistant to fluorine-based dry etching and can be removed by chlorine-based dry etching. The chromium-, oxygen- and nitrogen-containing material of the first layer and the third layer preferably do not contain silicon. As the chromium-, oxygen- and nitrogen-containing material of the first layer and the third layer, a material (CrON) material made of chromium (Cr), oxygen (O) and nitrogen (N) is suitable. On the other hand, the chromium-, oxygen-, nitrogen- and carbon-containing material of the second layer and the fourth layer also preferably do not contain silicon. As the chromium-, oxygen-, nitrogen- and carbon-containing material in the second layer and the fourth layer, a material (CrONC) material made of chromium (Cr), oxygen (O), nitrogen (N) and carbon (C) is suitable.

As a film made of a chromium-containing material, an optical film such as a light-shielding film of a transmissive photomask and an anti-reflection film, and a hard mask film that functions as an etching mask when etching a film made of a silicon-containing material in contact with a film made of a chromium-containing material are suitable. When the film made of the chromium-containing material is a light-shielding film, each layer can be selected from a light-shielding layer and an anti-reflection layer, and for example, the first layer can be an anti-reflection layer, the second layer and the fourth layer can be a light-shielding layer, and the third layer can be an anti-reflection layer. Preferably, a film made of a chromium-containing material functions as a hard mask film particularly when etching a film made of a silicon-containing material, and then is left at a portion of the film made of the silicon-containing material. Specifically, it is preferable that for a photomask, a film made of a chromium-containing material is left at a portion, located at the outer peripheral edge part of the substrate, which is a region, where a circuit pattern is not formed, of a film made of a silicon-containing material, and used as a light-shielding film.

In addition, as a film made of a chromium-containing material, an optical film such as an absorption film of a reflective photomask, and a hard mask film that functions as an etching mask when etching a film made of a tantalum-containing material in contact with a film made of a chromium-containing material are suitable.

In the film made of the chromium-containing material of the present embodiment, the first layer (upper layer), which is a layer away from the substrate, has, for example, a chromium content of 40 atomic % or less, an oxygen content of 38 atomic % or more, and a nitrogen content of 22 atomic % or less.

The chromium content of the first layer is preferably 36 atomic % or less, and preferably 30 atomic % or more, particularly preferably 32 atomic % or more. The oxygen content of the first layer is preferably 48 atomic % or more, and preferably 60 atomic % or less, particularly preferably 55 atomic % or less. The nitrogen content of the first layer is preferably 17 atomic % or less, and preferably 5 atomic % or more, particularly preferably 10 atomic % or more. The thickness of the first layer is 6 nm or less. The thickness of the first layer is preferably 2 nm or more.

When manufacturing a photomask from a photomask blank, the first layer is a layer that comes into direct contact with the cleaning liquid and is a layer in contact with the resist film. In exposure using a photomask, it is a layer on which the exposure light is incident, and that is located away from the substrate in a film made of a chromium-containing material. Therefore, the first layer is required to have high chemical resistance to the cleaning liquid, high adhesion to the resist film, and difficulty in reflecting the exposure light.

Compared to chromium oxide (CrO), chromium oxynitride (CrON) does not dissolve in a mixture of sulfuric acid and hydrogen peroxide solution or ammonia-added water (ammonia-added hydrogen peroxide solution, APM), and can keep stable optical characteristics. In addition, chromium oxynitride (CrON) has a lower reflectance with respect to exposure light than chromium nitride (CrN), and when exposed using a photomask (when transferring a photomask pattern), it is possible to suppress the reflection of the exposure light to the object to be transferred. Therefore, it is advantageous when a film made of a chromium-containing material is a light-shielding film. Furthermore, chromium oxynitride (CrON) has good adhesion to the resist film, and in addition, compared with chromium nitride (CrN), chromium oxide (CrO) is good in that even when the resist film is removed from a film made of a chromium-containing material using a mixture of sulfuric acid and hydrogen peroxide solution, sulfate ions are unlikely to remain on the surface, so that adhesion with the resist film is unlikely to deteriorate even when the resist film is formed again. From such a viewpoint, it is beneficial that the first layer is made of a chromium-, oxygen- and nitrogen-containing material, and has the above-mentioned predetermined composition which is an oxygen-rich composition having a relatively high oxygen content.

Also, since the first layer is in contact with the second layer, the thinner the first layer, the more it is affected by the oxygen in the second layer, which has a relatively high oxygen content, when the first layer is formed, so that it is likely that the first layer has a composition having a high oxygen content and a low nitrogen content as described above. Therefore, from this point of view, it is beneficial to make the thickness of the first layer 6 nm or less.

In the film made of the chromium-containing material of the present embodiment, the second layer, which is the layer sandwiched between the first layer and the third layer, has, for example, a chromium content of 38 atomic % or less, an oxygen content of 30 atomic % or more, a nitrogen content of 18 atomic % or less, and a carbon content of 14 atomic % or less, and a film thickness of 22 nm or more and 32 nm or less. The chromium content of the second layer is preferably 36 atomic % or less, and preferably 30 atomic % or more, particularly preferably 32 atomic % or more.

The oxygen content of the second layer is preferably 34 atomic % or more, and preferably 42 atomic % or less, particularly preferably 39 atomic % or less. The nitrogen content of the second layer is preferably 17 atomic % or less, and preferably 10 atomic % or more, particularly preferably 12 atomic % or more. The carbon content of the second layer is preferably 12 atomic % or less, and preferably 5 atomic % or more, particularly preferably 8 atomic % or more. The thickness of the second layer is preferably 24 nm or more, and preferably 30 nm or less.

In order to assist the process of a minute space pattern by plasma during chlorine-based dry etching of a film made of a chromium-containing material, sufficient oxygen is required to be supplied from the film. For this reason, the second layer is a film having a relatively high oxygen content. Further, in order to improve the etching rate, it is effective that the second layer contains carbon and has properties such as those of chromium carbide (CrC) that lowers the film density. Further, in order to improve the etching rate, it is necessary that the oxygen content is relatively high. From these viewpoints, the second layer is made of a material containing carbon together with oxygen, and has the above-mentioned predetermined composition having a relatively high oxygen content.

Also, since the first layer has the restriction mentioned above and the third layer has the restriction described later, when it is required to ensure higher optical density for the entire film made of chromium-containing material, the optical density will be compensated by the second layer or the fourth layer. From this point of view, it is beneficial to make the thickness of the second layer 22 nm or more.

In the film made of the chromium-containing material of the present embodiment, the third layer, which is a layer toward the substrate, has, for example, a chromium content of 50 atomic % or less, an oxygen content of 30 atomic % or less, and a nitrogen content of 20 atomic % or more.

The chromium content of the third layer is preferably 46 atomic % or less, and preferably 30 atomic % or more, particularly preferably 35 atomic % or more. The oxygen content of the third layer is preferably 26 atomic % or less, and preferably 10 atomic % or more, particularly preferably 18 atomic % or more. The nitrogen content of the third layer is preferably 24 atomic % or more, and preferably 32 atomic % or less, particularly preferably 30 atomic % or less. The thickness of the third layer is preferably 4 nm or less, and preferably 2 nm or more.

A resist film is formed on the surface of a film made of a chromium-containing material. In a case where the sheet resistance of the film made of the chromium-containing material is high, when a pattern is drawn on the resist film using an electron beam, the surface layer part of the film made of the chromium-containing material is charged by the electron beam, and the radiation position of the electron beam shifts, so that the electron beam may not be radiated at a predetermined position. In this case, the pattern is not formed at a predetermined position, and as a result, the circuit of the device to be manufactured is not formed correctly, which causes a malfunction of the device. Therefore, the sheet resistance of the film made of the chromium-containing material is preferably low. For the reason mentioned above, the first layer is made of a chromium-, oxygen- and nitrogen-containing material, and has an oxygen-rich composition with a relatively high oxygen content. Chromium oxide (CrO) has a higher sheet resistance than chromium nitride (CrN), and the first layer, which is made of chromium oxynitride (CrON) having an oxygen-rich composition, has a relatively high sheet resistance. In addition, for the reasons mentioned above, the second layer is made of a chromium-, oxygen-, nitrogen- and carbon-containing material, and has a composition having a relatively high oxygen content. The second layer, which is made of chromium oxynitride carbide (CrONC), also has a relatively high sheet resistance. Therefore, from the viewpoint of sheet resistance of the entire film made of a chromium-containing material, it is beneficial that the third layer in contact with the second layer is provided, and the third layer is made of a chromium-, oxygen- and nitrogen-containing material, and has the above-mentioned predetermined composition having a relatively high nitrogen content.

In addition, the third layer has a composition having a reasonably high nitrogen content, compared with the first layer and the second layer. Chromium nitride (CrN) has a low etching rate in chlorine-based dry etching, compared with chromium oxide (CrO), and the third layer, which is made of chromium oxynitride (CrON) having a composition having a relatively high nitrogen content, has a relatively low etching rate. The longer time it takes to etch a film made of a chromium-containing material, the thicker the resist film is required to be, and the thicker the resist film, the more the resolution of the line pattern, particularly the resolution of the assist pattern of the line pattern deteriorates. From the viewpoint of shortening the etching time of the second layer as described above, the thickness of the third layer is preferably 4 nm or less, and in this way, the film thickness of the resist film formed on the film made of the chromium-containing material can be relatively reduced.

In the sheet resistance of the film made of the chromium-containing material, the combined sheet resistance of the first layer, the second layer, and the third layer, preferably the combined sheet resistance of the first layer, the second layer, the third layer, and the fourth layer is preferably 350 k$\Omega$/$\square$ or less, particularly preferably 250 k$\Omega$/$\square$ or less. Due to the above-mentioned characteristics of the first layer, the second layer and the third layer, it is possible to obtain the film made of the chromium-containing material having such sheet resistance. Even when the first layer and the second layer are films having high sheet resistance, the sheet resistance of the entire film can be reduced by inserting the third layer.

Further, since the third layer is in contact with the first layer and the second layer, the thinner the total of the first layer and the second layer is, the more the film is affected by the third layer having a higher conductivity when the first layer and the second layer are formed, so that it is easy to make the first layer and the second layer have a composition with a low conductivity. Therefore, from this point of view, it is beneficial to set the thickness of the second layer to 32 nm or less.

Further, as an example, as will be described later, the fourth layer having a high etching rate is disposed adjacent to the third layer. When etching a chromium-containing material, in the case of a thick film having a high etching rate, large side etching occurs in the vicinity of the center of the film. As a result, in the dry etching process, the line width from the vicinity of the center of the isolated line pattern in the thickness direction toward the substrate is smaller than the line width the vicinity of the center of the isolated line pattern in the thickness direction toward a direction away from the substrate, and the pattern shape is unstable, so that part of the chromium-containing film disappears. Therefore, by inserting the third film with a relatively slow etching rate between the second and the fourth films with a high etching rate, it is possible to divide a film into two, a thick film with a high etching rate, and a thin film with a high etching rate. As a result, the amount of side etching can be reduced, and a more rectangular isolated line pattern can be formed. By preventing part of the chromium-containing film from disappearing due to the unstable pattern shape in the dry etching process, a good resolution limit can be achieved in the formation of the assist pattern of the line pattern, which assists the resolution of the main pattern of the photomask.

In the film made of the chromium-containing material of the present embodiment, the fourth layer, which is the layer toward the substrate, has, as an example, a chromium content of 44 atomic % or less, an oxygen content of 20 atomic % or more, a nitrogen content of 20 atomic % or less, and a carbon content of 16 atomic % or less, and a film thickness of 13 nm or more.

The chromium content of the fourth layer is preferably 36 atomic % or less, and preferably 30 atomic % or more, particularly preferably 32 atomic % or more. The oxygen content of the fourth layer is preferably 30 atomic % or more, and preferably 42 atomic % or less, particularly preferably 38 atomic % or less. The nitrogen content of the fourth layer is preferably 18 atomic % or less, and preferably 10 atomic % or more, particularly preferably 12 atomic % or more. The carbon content of the fourth layer is preferably 15 atomic % or less, and preferably 6 atomic % or more, particularly preferably 9 atomic % or more. The thickness of the fourth layer is preferably 14 nm or more, and preferably 50 nm or less, particularly preferably 40 nm or less.

In order to assist the process of a minute space pattern by plasma during chlorine-based dry etching of a film made of a chromium-containing material, sufficient oxygen is required to be supplied from the film. For this reason, the fourth layer is a film having a relatively high oxygen content. Further, in order to improve the etching rate, it is effective that the fourth layer contains carbon and has properties such as those of chromium carbide (CrC) that lowers the film density. Further, in order to improve the etching rate, it is necessary that the oxygen content is relatively high. From these viewpoints, it is beneficial that the fourth layer is made of a material containing carbon together with oxygen, and has the above-mentioned predetermined composition having a relatively high oxygen content.

Also, since the fourth layer has the restriction mentioned above and the first layer, the second layer, and the third layer have the restriction described later, when it is required to ensure higher optical density for the entire film made of chromium-containing material, the optical density will be compensated by the second layer or the fourth layer. From this point of view, the thickness of the fourth layer is set to 13 nm or more.

When the film made of the chromium-containing material is a light-shielding film, particularly when it is a photomask, when a film is left as a light-shielding film at a portion, located at the outer peripheral edge part of the substrate, which is a region, where a circuit pattern is not formed, of a film made of a silicon-containing material, the combined optical density (OD) of a film made of a silicon-containing material, which is a phase shift film, and the light-shielding film is set to over 2.0, particularly 2.5 or above, usually preferably 3 or more with respect to exposure light, for example, light with a wavelength of 250 nm or less, particularly light with a wavelength of 200 nm or less such as ArF excimer laser (193 nm) and $F_2$ laser (wavelength 157 nm). For example, when the film made of the silicon-containing material is a phase shift film having a transmittance of 6% or more and 30% or less (optical density of 0.53 or more and 1.22 or less) with respect to exposure light, in order to set the combined optical density of the phase shift film and the light-shielding film to 3 or more, the optical density of the film made of the chromium-containing material (the total of the first layer, the second layer, the third layer and the fourth layer) with respect to exposure light is required to be 1.78 or more. It is possible to obtain a film made of a chromium-containing material having such an optical density due to the above-mentioned characteristics of the first layer, the second layer, the third layer and the fourth layer. The upper limit of the optical density of the film (the total of the first layer, the second layer, the third layer, and the fourth layer) made of the chromium-containing material with respect to exposure light is usually 3.2 or less.

The film thickness (the total thickness of the first layer, the second layer, the third layer, and the fourth layer) of the film made of the chromium-containing material is preferably 39 nm or more, particularly preferably 48 nm or more, and preferably 94 nm or less, particularly preferably 85 nm or less. Specifically, when a film made of a chromium-containing material is a photomask, in a case where a film is left as a light-shielding film at a portion, located at the outer peripheral edge part of the substrate, which is a region, where a circuit pattern is not formed, of a film made of a silicon-containing material, the film thickness of the film made of the chromium-containing material is preferably 48 nm or more, and preferably 85 nm or less.

Both the first layer and the third layer may contain carbon when the amount thereof is small. The carbon content is preferably less than 5 atomic %, particularly preferably 3 atomic % or less, still particularly preferably 2 atomic % or less, and it is more preferable that the layer does not contain carbon. Examples of the chromium-, oxygen-, nitrogen- and carbon-containing material of the first layer and the third layer include a material (CrONC) made of chromium (Cr), oxygen (O), nitrogen (N) and carbon (C).

The photomask blank of the present embodiment may further have a resist film in contact with a side, of the film made of the chromium-containing material, which is away from the substrate. The resist film may be an electron beam resist drawn with an electron beam or a photoresist drawn with light, and a chemically amplified resist is particularly preferable. The chemically amplified resist may be positive or negative, contains, for example, an acid generator and a base resin such as a hydroxystyrene-based resin and a (meth) acrylic acid-based resin, and when necessary, adds a cross-linking agent, a quencher, a surfactant and the like. From the viewpoint of preventing the resist pattern from collapsing in the development process and the rinsing process after development when a fine pattern is formed, the film thickness of the resist film is preferably 50 nm or more, particularly preferably 70 nm or more, and 200 nm or less, particularly preferably 150 nm or less.

Figure 5:
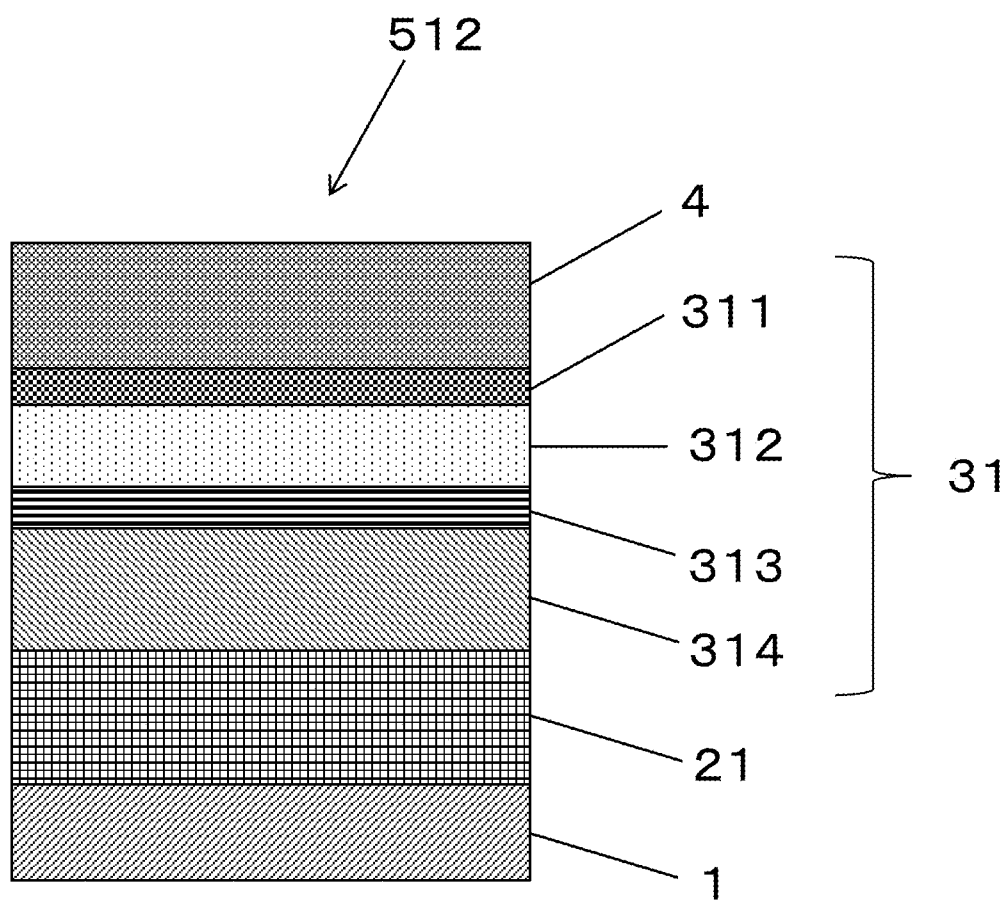
FIG. 5 is a cross-sectional view showing another example of the first aspect (phase shift mask blank) of the photomask blank of the present invention.

FIG. 5 is a cross-sectional view showing another example of the first aspect of the photomask blank of the present embodiment. This photomask blank is a phase shift mask blank. A phase shift mask blank 512 has a resist film 4 in contact with the hard mask film 31 of the photomask blank shown in FIG. 1. The phase shift mask 513 shown in FIG. 2 can also be manufactured from the phase shift mask blank 512 shown in FIG. 5.

Figure 6:
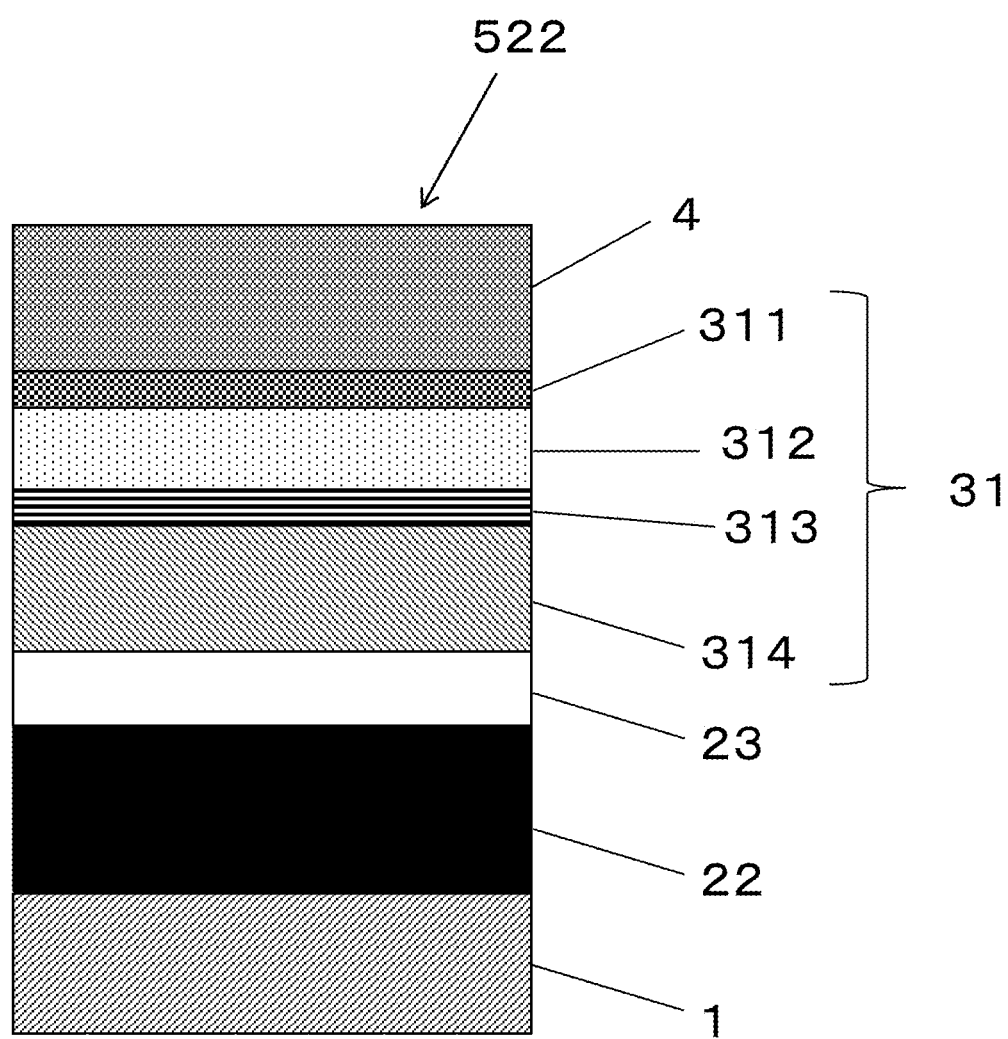
FIG. 6 is a cross-sectional view showing another example of the second aspect (reflective mask blank) of the photomask blank of the present invention.

On the other hand, FIG. 6 is a cross-sectional view showing another example of the second aspect of the photomask blank of the present embodiment. This photomask blank is a reflective mask blank. A reflective mask blank 522 has a resist film 4 in contact with the hard mask film 31 of the photomask blank shown in FIG. 3. The reflective mask 523 shown in FIG. 4 can also be manufactured from the reflective mask blank 522 shown in FIG. 6.

The formation of the film made of the chromium-containing material, the film made of the silicon-containing material, the film made of the tantalum-containing material, and the reflective film of the present embodiment is not particularly limited, but since it is easy to form a film having good controllability and predetermined characteristics, the formation by the sputtering method is preferable. The sputtering method includes DC sputtering, RF sputtering and the like, and has no particular limitation.

When a film containing chromium but not containing silicon is formed as a film made of a chromium-containing material, a chromium target can be used as the sputter target. On the other hand, when a film containing silicon but not containing a transition metal is formed as a film made of a silicon-containing material, a silicon (Si) target can be used as the sputter target. In addition, when a film containing a transition metal (Me) other than chromium and silicon but not containing chromium is formed as a film made of a silicon-containing material, a target containing a transition metal (Me) other than chromium and silicon can be used as the sputter target. In this case, it is possible to perform co-sputtering using a plurality of targets containing transition metals (Me) other than chromium and silicon using a silicon (Si) target and transition metal (Me) targets other than chromium, and having different compositions (some or all of the constituent elements are different, or the constituent elements are the same but their concentrations are different), or using a silicon (Si) target or a transition metal (Me) target other than chromium, and a target containing a transition metal (Me) other than chromium and silicon. When forming a film made of a tantalum-containing material, a tantalum (Ta) target, a (TaB) target made of tantalum and boron, or the like can be used as the sputter target. Further, when forming a reflective film, in a case where a molybdenum (Mo) target, a silicon (Si) target, and a protective film are usually formed, a ruthenium (Ru) target is usually used.

The electric power applied to the sputter target may be appropriately set according to the size of the sputter target, cooling efficiency, ease of controlling film formation, and the like. Usually, the power per area of the sputtered surface of the sputter target may be 0.1 to 10 W/cm$^2$.

When forming a film of a material made of only silicon, or silicon and a transition metal only, only a rare gas such as a helium gas (He), a neon gas (Ne), or an argon gas (Ar) is used as the sputter gas. On the other hand, when forming a film of a material containing oxygen, nitrogen or carbon, the sputtering is preferably reactive sputtering. Examples of the sputter gas include a rare gas such as a helium gas (He), a neon gas (Ne), and an argon gas (Ar), and a reactive gas. For example, when forming a film of a material containing oxygen, oxygen gas ($O_2$ gas) is used as the reactive gas, and when forming a film of a material containing nitrogen, nitrogen gas ($N_2$ gas) is used as the reactive gas. Also, when forming a film of a material containing both nitrogen and oxygen, the oxygen gas ($O_2$ gas) and the nitrogen gas ($N_2$ gas) may be used at the same time, or the nitric oxide gas such as a nitric oxide gas (NO gas), a nitrogen dioxide gas ($NO_2$ gas), and a nitrous oxide gas ($N_2O$ gas) may be used as the reactive gas. When forming a film of a material containing carbon, a gas containing carbon such as a methane gas ($CH_4$), a carbon monoxide gas (CO gas), and a carbon dioxide gas ($CO_2$ gas) may be used as the reactive gas.

The pressure at the time of film formation may be appropriately set in consideration of film stress, chemical resistance, cleaning resistance, etc., and is usually 0.01 Pa or more, particularly 0.03 Pa or more, and 1 Pa or less, particularly 0.3 Pa or less, so that chemical resistance is improved. Further, each gas flow rate may be appropriately set so as to have a desired composition, and is usually 0.1 to 100 sccm.

In the process of manufacturing the photomask blank, the substrate, or the substrate and the film formed on the substrate may be heat-treated. The heat treatment method includes infrared heating, resistance heating and the like, and the treatment conditions are not particularly limited. The heat treatment can be carried out, for example, in a gas atmosphere containing oxygen. The concentration of the gas containing oxygen is not particularly limited, and for example, in the case of oxygen gas ($O_2$ gas), it can be 1 to 100% by volume. The temperature of the heat treatment is preferably 200° C. or higher, particularly preferably 400° C. or higher. Further, in the process of manufacturing a photomask blank, a film formed on a substrate, particularly a film made of a chromium-containing material, may be subjected to ozone treatment, plasma treatment, or the like, and the treatment conditions are also not particularly limited. Any of the treatments can be carried out for the purpose of increasing the oxygen concentration on the surface part of the film, and in this case, the treatment conditions may be appropriately adjusted so as to obtain a predetermined oxygen concentration. When forming the film by sputtering, it is also possible to increase the oxygen concentration on the surface part of the film by adjusting the ratio of a rare gas in sputter gas to an oxygen-containing gas (oxidizing gas) such as an oxygen gas ($O_2$ gas), a carbon monoxide gas (CO gas), and a carbon dioxide gas ($CO_2$ gas).

In the process of manufacturing the photomask blank, a cleaning treatment may be performed in order to remove particles existing on the substrate or the surface of the film formed on the substrate. The cleaning can be carried out using one or both of ultrapure water and functional water which is ultrapure water containing ozone gas, hydrogen gas and the like. Further, after cleaning with ultrapure water containing a surfactant, further cleaning may be performed with one or both of ultrapure water and functional water. The cleaning can be carried out while irradiating ultrasonic waves as needed, and further, the UV light irradiation can be combined.

When a resist film is formed in the photomask blank of the present embodiment, the method of applying the resist film is not particularly limited, and a known method can be applied.

Figure 7A:
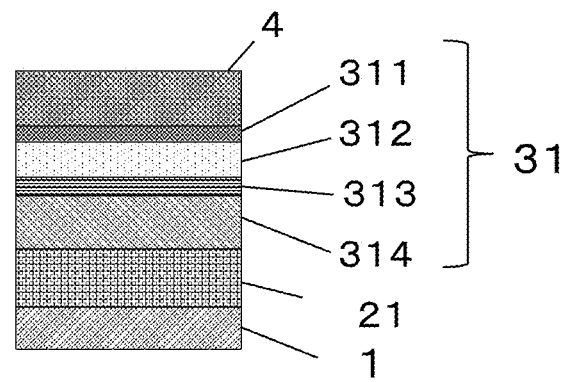
FIG. 7A is a cross-sectional diagram for explaining a step of manufacturing a phase shift mask from a phase shift mask blank according to the first aspect of the present invention.
Figure 7B:
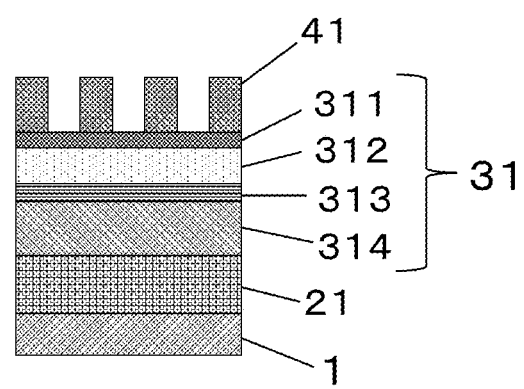
FIG. 7B is a step following FIG. 7A, and is a cross-sectional diagram for explaining a step of manufacturing the phase shift mask from the phase shift mask blank according to the first aspect of the present invention.

A photomask can be manufactured from the photomask blank of the present embodiment. FIGS. 7A to 9C are cross-sectional diagrams for explaining a process of manufacturing a phase shift mask from the phase shift mask blank of the first aspect of the present embodiment. In this case, first, as shown in FIG. 7A, a resist film (preferably having a film thickness of 50 nm or more and 200 nm or less) 4 is formed in contact with a side, of the film (hard mask film 31) made of a chromium-containing material, which is away from the transparent substrate 1 (step (A)). Next, as shown in FIG. 7B, the resist film 4 is patterned to form a resist pattern 41 (step (C)). After step (A) and before step (C), the resist film 4 may be removed using a mixture of sulfuric acid and hydrogen peroxide solution to form a new resist film 4 (step (B)).

Figure 7C:
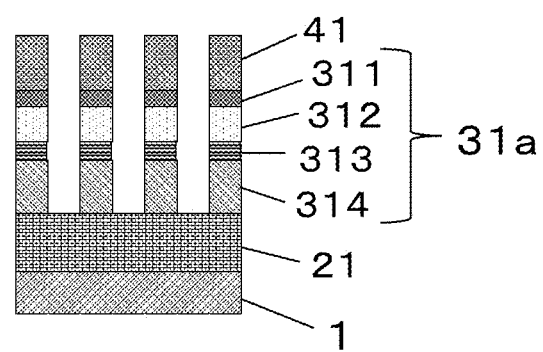
FIG. 7C is a step following FIG. 7B, and is a cross-sectional diagram for explaining a step of manufacturing the phase shift mask from the phase shift mask blank according to the first aspect of the present invention.
Figure 8A:
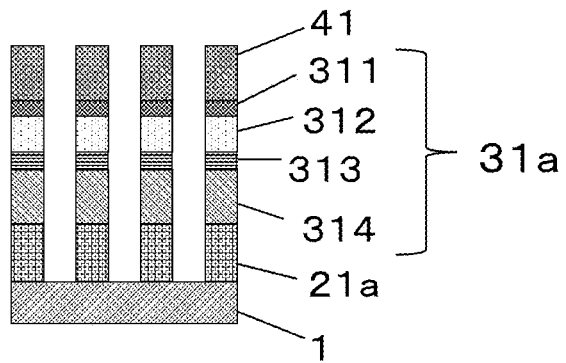
FIG. 8A is a step following FIG. 7C, and is a cross-sectional diagram for explaining a step of manufacturing the phase shift mask from the phase shift mask blank according to the first aspect of the present invention.

Then, as shown in FIG. 7C, using the resist pattern 41 as the etching mask, a film (hard mask film 31) made of a chromium-containing material composed of the first layer 311, the second layer 312, the third layer 313, and the fourth layer 314 is patterned by chlorine-based dry etching to form a pattern (hard mask film pattern 31a) of the film made of a chromium-containing material (step (D)). Then, as shown in FIG. 8A, a pattern (hard mask film pattern 31a) of the film made of a chromium-containing material is used as an etching mask, and a film (phase shift film 21) made of a silicon-containing material is patterned by fluorine-based dry etching to form a pattern (phase shift film pattern 21a) of the film made of a silicon-containing material (step (E)). Then, a photomask (phase shift mask) can be obtained by appropriately removing the remaining resist pattern 41 and the pattern of the film made of the chromium-containing material (hard mask film pattern 31a) when necessary.

Figure 8B:
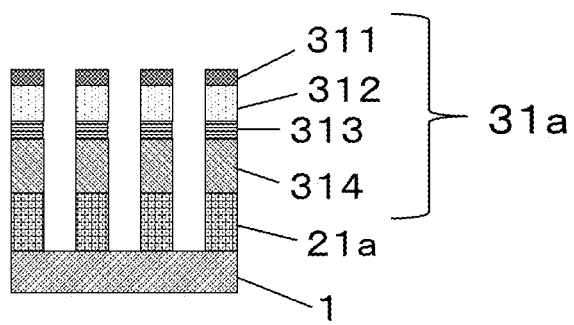
FIG. 8B is a step following FIG. 8A, and is a cross-sectional diagram for explaining a step of manufacturing the phase shift mask from the phase shift mask blank according to the first aspect of the present invention.
Figure 8C:
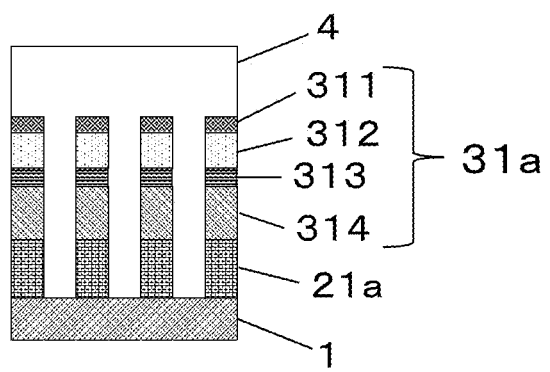
FIG. 8C is a step following FIG. 8B, and is a cross-sectional diagram for explaining a step of manufacturing the phase shift mask from the phase shift mask blank according to the first aspect of the present invention.
Figure 9A:
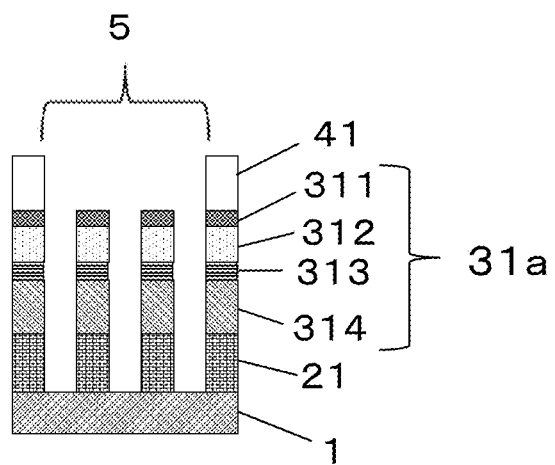
FIG. 9A is a step following FIG. 8C, and is a cross-sectional diagram for explaining a step of manufacturing the phase shift mask from the phase shift mask blank according to the first aspect of the present invention.
Figure 9B:
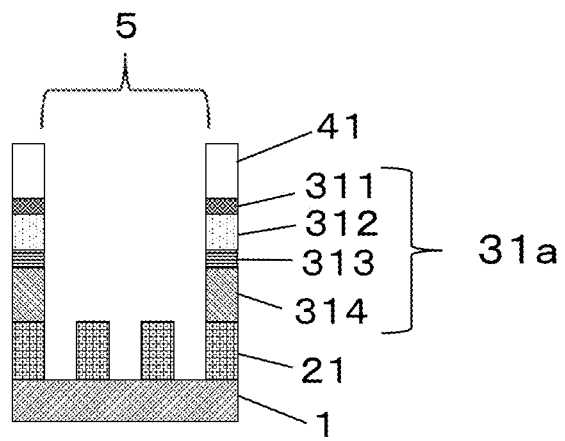
FIG. 9B is a step following FIG. 9A, and is a cross-sectional diagram for explaining a step of manufacturing the phase shift mask from the phase shift mask blank according to the first aspect of the present invention.
Figure 9C:
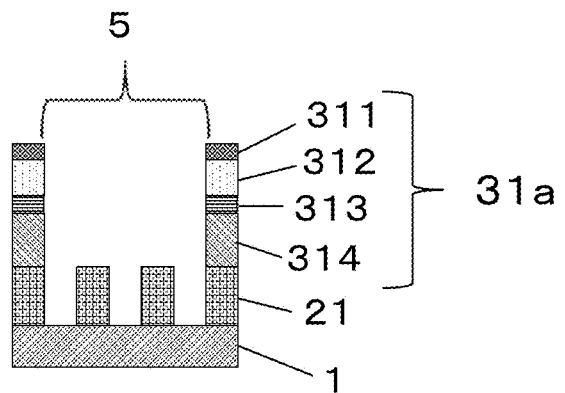
FIG. 9C is a step following FIG. 9B, and is a cross-sectional diagram for explaining a step of manufacturing the phase shift mask from the phase shift mask blank according to the first aspect of the present invention.

When leaving a film made of a chromium-containing material at the outer peripheral edge part of a transparent substrate which is a region, where a circuit pattern is not formed, of a film made of a silicon-containing material, after step (E), a film made of a chromium-containing material is left at a portion, located at the outer peripheral edge part of the transparent substrate, which is a region, where a circuit pattern is not formed, of a film made of a silicon-containing material, and a pattern of the film made of the chromium-containing material in other than the outer peripheral edge part is removed by dry etching using an oxygen-containing chlorine-based gas (step (F)). In this case, in step (F), after step (E), first, as shown in FIG. 8B, the remaining resist pattern 41 is removed. Next, as shown in FIG. 8C, a new resist film 4 is formed on the transparent substrate 1 and a pattern (hard mask film pattern 31a) of the film made of a chromium-containing material. Then, as shown in FIG. 9A, the resist film 4 is patterned so that the resist film 4 is left at a portion, located at the outer peripheral edge part of the transparent substrate 1, which is a region, where the circuit pattern (phase shift film pattern 21a) is not formed, of the film made of the silicon-containing material to form the resist pattern 41. Then, as shown in FIG. 9B, using the resist pattern 41 as the etching mask, a pattern (hard mask film pattern 31a) of the film made of a chromium-containing material in the circuit pattern (mask pattern) forming region is removed by chlorine-based dry etching. Finally, as shown in FIG. 9C, by removing the remaining resist pattern 41, a circuit pattern (phase shift film pattern 21a) of a film made of a silicon-containing material is formed in the effective region 5, and it is possible to obtain a photomask (phase shift mask) in which the light-shielding film pattern 31b remains at a portion, located at the outer peripheral edge part of the transparent substrate, which is a region, where a circuit pattern is not formed, of a film made of a silicon-containing material.

As a method of manufacturing a photomask from the photomask blank of the present embodiment, in FIGS. 7A to 9C, the method of manufacturing the phase shift mask from the phase shift mask blank is described as an example. When manufacturing the reflective mask from the reflective mask blank, etching conditions are selected according to the etching characteristics of each film, an absorption film pattern is formed by a conventionally known method, and a reflective mask having a reflective film and an absorption film pattern can be manufactured from a reflective mask blank with the reflective film and the absorption film.

In photolithography for forming a pattern having a half pitch of 50 nm or less, preferably 30 nm or less, more preferably 20 nm or less, and further preferably 10 nm or less on a substrate to be processed, the photomask of the present embodiment is particularly effective in exposure in which a pattern is transferred on the photoresist film formed on the substrate to be processed using exposure light with a wavelength of 250 nm or less, particularly a wavelength of 200 nm or less, such as an ArF excimer laser (wavelength 193 nm) or an $F_2$ laser (wavelength 157 nm), or an extreme ultraviolet region light with a wavelength of 13 to 14 nm as exposure light.

In the pattern exposure method using the photomask of the present embodiment, a photomask manufactured from a photomask blank is used, the photomask pattern is irradiated with exposure light to transfer the photomask pattern to the photoresist film on which exposure of the photomask pattern formed on the substrate to be processed is to be performed. The radiation of the exposure light may be exposure under dry conditions or immersion exposure, and in particular, it can be suitably used when immersion exposure of a photomask pattern is performed on a wafer of 300 mm or more as a substrate to be processed.

EXAMPLES

Hereinafter, the present embodiment will be specifically described with reference to Examples and Comparative Examples, but the present embodiment is not limited to the following Examples.

Example 1

A photomask blank (halftone phase shift mask blank) was manufactured by laminating a phase shift film (halftone phase shift film) as a film made of a silicon-containing material on a transparent substrate made of quartz with a size of 152 mm square and a thickness of about 6 mm and a hard mask film as a film made of a chromium-containing material.

First, the power applied to the target was adjusted using a molybdenum target and a silicon target as a target on a transparent substrate, and sputtering was performed in these gas atmospheres using an argon gas and a nitrogen gas as a sputter gas, and a MoSi-based phase shift film, made of MoSiN, (thickness 70 nm) having a phase difference of 177 degrees and a transmittance of 6% (optical density 1.2) with respect to light having a wavelength of 193 nm was formed as a single-layer film.

Example 2

Example 2 was the same as Example 1 except that the composition and thickness of each of the first layer, the second layer, the third layer, and the fourth layer of the hard mask film were changed so that the fourth layer of the hard mask film had reduced chromium atom %, and increased oxygen atom %, nitrogen atom %, and carbon atom %, compared with that of Example 1, and the optical density of the entire hard mask film was the same as that of Example 1, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Example 3

Example 3 was the same as Example 1 except that the composition and thickness of each of the first layer, the second layer, the third layer, and the fourth layer of the hard mask film were changed so that the fourth layer of the hard mask film had reduced chromium atom %, and increased oxygen atom %, nitrogen atom %, and carbon atom %, compared with that of Example 1, and the optical density of the entire hard mask film was the same as that of Example 1, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Example 4

Example 4 was the same as Example 1 except that the composition and thickness of each of the first layer, the second layer, the third layer, and the fourth layer of the hard mask film were changed so that the fourth layer of the hard mask film had increased chromium atom % and nitrogen atom %, and decreased oxygen atom %, compared with that of Example 1, and the optical density of the entire hard mask film was the same as that of Example 1, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Example 5

Example 5 was the same as Example 1 except that the composition and thickness of each of the first layer, the second layer, the third layer, and the fourth layer of the hard mask film were changed so that the fourth layer of the hard mask film had reduced chromium atom %, and increased oxygen atom % and nitrogen atom %, compared with that of Example 1, and the optical density of the entire hard mask film was the same as that of Example 1, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Next, the power applied to the target was adjusted using a chromium target on the phase shift film as a target, and the sputter gas ratio was adjusted using an argon gas, an oxygen gas, and a nitrogen gas as a sputter gas to perform sputtering on the fourth layer, the third layer, the second layer, and the first layer in this order in these gas atmospheres to form a hard mask film consisting of the first layer, the second layer, the third layer, and the fourth layer in order from a side away from the transparent substrate, where the first layer was made of chromium oxynitride (CrON), the second layer was made of chromium oxynitride carbide (CrONC), the third layer was made of chromium oxynitride (CrON), and the fourth layer was made of chromium oxynitride carbide (CrONC), so that a photomask blank without a resist film was obtained as shown in FIG. 1. Table 1 shows the composition and thickness of each layer of the hard mask film, and the optical density of the entire hard mask film with respect to light having a wavelength of 193 nm. The composition was measured using X-ray photoelectron spectroscopy analyzer K-Alpha manufactured by Thermo Fisher Scientific K.K., the thickness of the film (layer) was measured using needle-contact type step meter P-16+ manufactured by KLA-Tencor Corporation, and the optical density was measured using X-ray visible near infrared spectrophotometer SolidSpec-3700 manufactured by Shimadzu Corporation (the same applies hereinafter).

Comparative Example 1

Comparative Example 1 was the same as Example 1 except that the composition and thickness of each of the first layer, the second layer, and the third layer of the hard mask film were changed so that the second layer of the hard mask film was made of chromium oxynitride (CrON) instead of chromium oxynitride carbide (CrONC), and the optical density of the entire hard mask film was the same as that of Example 1 without using the fourth layer, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Comparative Example 2

Comparative Example 2 was the same as Example 1 except that the composition and thickness of each of the first layer, the second layer, the third layer, and the fourth layer of the hard mask film were changed so that the second layer of the hard mask film had increased chromium atom %, and decreased oxygen atom %, nitrogen atom %, and carbon atom %, compared with that of Example 1, and the optical density of the entire hard mask film was the same as that of Example 1, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Comparative Example 3

Comparative Example 3 was the same as Example 1 except that the composition and thickness of each of the first layer, the second layer, the third layer, and the fourth layer of the hard mask film were changed so that the fourth layer of the hard mask film had reduced chromium atom % and carbon atom %, and increased oxygen atom % and nitrogen atom %, compared with that of Example 1, and the optical density of the entire hard mask film was the same as that of Example 1, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Comparative Example 4

Comparative Example 4 was the same as Example 1 except that the composition and thickness of the first layer of the hard mask film were changed so that chromium oxynitride carbide was formed into a single layer, and the optical density of the entire hard mask film was the same as that of Example 1, and a phase shift film and a hard mask film were formed on the transparent substrate to obtain a photomask blank without a resist film. A resist film was further formed on the hard mask film to obtain a photomask blank having a resist film. Table 1 shows the composition and thickness of each layer of the hard mask film, and the optical density of the entire hard mask film with respect to light having a wavelength of 193 nm.

Example 6

In order to evaluate the time (clear time) until the chrome film disappears in the dry etching process of the hard mask film, the evaluation was performed using the photomask blanks obtained in Example 1, Example 2, Example 3, Example 4, Example 5, Comparative Example 1, Comparative Example 2, Comparative Example 3, and Comparative Example 4.

Chlorine-based dry etching was performed on the hard mask film using chlorine-based gas containing oxygen gas under the following conditions, and the time for end point detection (endpoint) was evaluated. The results are shown in Table 2.

<Chlorine-Based Dry Etching Conditions>
Equipment: inductively coupled plasma (ICP) method
Gas: $Cl_2$ gas+$O_2$ gas
Gas pressure: 3.0 m Torr (0.40 Pa)
ICP power: 350 W As shown in Table 2, it was confirmed that the phase shift mask blank of Comparative Example 1 had a slow clear time, whereas the phase shift mask blanks of Example 1, Example 2, Example 3, Example 4, and Example 5 which were the photomask blanks of the present embodiment had a fast clear time. It is conceivable that this is because the second layer and the fourth layer of the hard mask film contain chromium carbide (CrC), the film density is lowered, and the oxygen content for improving the etching rate is relatively high.

Next, in order to evaluate the resist film thickness that is etched and disappears together with the chrome film in the dry etching process of the hard mask film, the evaluation was performed using the photomask blanks obtained in Example 1, Example 2, Example 3, Example 4, Example 5, Comparative Example 1, Comparative Example 2, Comparative Example 3, and Comparative Example 4.

Negative type chemically amplified electron beam resist SEBN3015 (manufactured by Shin-Etsu Chemical Co., Ltd.) was spin-coated on the hard mask film of the photomask blanks obtained in Example 1, Example 2, Example 3, Example 4, Example 5, Comparative Example 1, Comparative Example 2, Comparative Example 3, and Comparative Example 4 to form a resist film having a film thickness of 150 nm to obtain a photomask blank having a resist film as shown in FIG. 5.

The evaluation was performed according to the steps from FIG. 7A to FIG. 7C.

A photomask blank having a resist film was prepared (FIG. 7A). Next, a total of 20 isolated line patterns with a long side dimension of 100,000 nm and a short side dimension of 200 nm were drawn using an electron beam drawing apparatus with a dose amount of 35 $\mu C/cm^2$. Then, using a heat treatment apparatus, heat treatment (PEB: Post Exposure Bake) was performed at 110° C. for 14 minutes. Next, paddle development was performed for 100 seconds to form a resist pattern (FIG. 7B). Next, chlorine-based dry etching was performed on the hard mask film under the following conditions using a chlorine-based gas containing oxygen gas to form a hard mask film pattern (FIG. 7C). The remaining resist film thickness was measured to evaluate the resist film thickness which has disappeared by dry etching of the hard mask film. The results are shown in Table 2. The thickness of the resist film was measured using needle-contact type step meter P-16+ manufactured by KLA-Tencor Corporation.

Further, when the resist film thickness required after dry etching of the hard mask film was 35 nm, the required initial resist film thickness was evaluated. When the resist film thickness required after dry etching of the hard mask film is 35 nm or less, since the plasma that penetrates the resist reaches the chrome hard mask and causes pinhole defects, the resist film thickness required after dry etching of the hard mask film was set to 35 nm. The results are shown in Table 2.

As shown in Table 2, it was confirmed that the phase shift mask blank of Comparative Example 1 required a thick initial film thickness because the clear time was slow, whereas the phase shift mask blanks of Example 1, Example 2, Example 3, Example 4, and Example 5, which are the photomask blanks of the present embodiment had a thin initial resist film thickness because the clear time was fast. It is conceivable that this is because the second layer and the fourth layer of the hard mask film contains chromium carbide (CrC), the film density decreases, and the oxygen content for improving the etching rate is relatively high.

<Chlorine-Based Dry Etching Conditions>
Equipment: inductively coupled plasma (ICP) method
Gas: $Cl_2$ gas+$O_2$ gas
Gas pressure: 3.0 m Torr (0.40 Pa)
ICP power: 350 W
Overetching amount: 100%

Next, negative type chemically amplified electron beam resist SEBN3015 (manufactured by Shin-Etsu Chemical Co., Ltd.) was spin-coated on the hard mask film of Example 1, Example 2, Example 3, Example 4, Example 5, Comparative Example 2, Comparative Example 3, and Comparative Example 4 to form a resist film having a film thickness of 130 nm to obtain a photomask blank having a resist film as shown in FIG. 5.

Since Comparative Example 1 has a relatively slow clear time, the resist damage due to dry etching of the chrome film is larger than that of Example 1, Example 2, Example 3, Example 4, Example 5, Comparative Example 2, Comparative Example 3, and Comparative Example 4, and a relatively thicker resist is required to be applied. Therefore, negative type chemically amplified electron beam resist SEBN3015 (manufactured by Shin-Etsu Chemical Co., Ltd.) was spin-coated on the hard mask film of Comparative Example 1 to form a resist film having a film thickness of 160 nm to obtain a photomask blank having a resist film as shown in FIG. 5.

Example 7

To evaluate the resolution limit of the fine pattern corresponding to the assist pattern of the line pattern, photomasks (halftone phase shift masks) as shown in FIG. 2 were manufactured according to the steps shown in FIGS. 7A to 9C using the photomask blanks having the resist films obtained in Example 1, Example 2, Example 3, Example 4, Example 5, Comparative Example 1, Comparative Example 2, Comparative Example 3, and Comparative Example 4.

First, a photomask blank having a resist film was prepared (FIG. 7A). Next, using an electron beam drawing apparatus, a total of 200,000 isolated patterns with different short side dimensions were drawn with the long side dimension of 140 nm and the short side dimension being changed by 2 nm from 20 nm to 100 nm as a test pattern corresponding to the assist pattern of the line pattern with a dose amount of 35 $\mu C/cm^2$. Then, using a heat treatment apparatus, heat treatment (PEB: Post Exposure Bake) was performed at 110° C. for 14 minutes. Next, paddle development was performed for 100 seconds to form a resist pattern (FIG. 7B). Next, chlorine-based dry etching was performed on the hard mask film under the following conditions using a chlorine-based gas containing oxygen gas to form a hard mask film pattern (FIG. 7C). Next, fluorine-based dry etching was performed on the phase shift film under the following conditions using a fluorine-based gas to form a phase shift film pattern (FIG. 8A).

<Chlorine-Based Dry Etching Conditions>
Equipment: inductively coupled plasma (ICP) method
Gas: $Cl_2$ gas+$O_2$ gas
Gas pressure: 3.0 m Torr (0.40 Pa)
ICP power: 350 W <Fluorine-Based Dry Etching Conditions>
Equipment: ICP
Gas: $SF_6$ gas+He gas
Gas pressure: 4.0 m Torr (0.53 Pa)
ICP power: 400 W Next, the resist pattern was removed by washing with sulfuric acid hydrogen peroxide (a mixture of sulfuric acid and hydrogen peroxide solution (sulfuric acid: hydrogen peroxide solution=3:1), the same applies hereinafter) (FIG. 8B). Next, laser drawing resist IP3000 (manufactured by Tokyo Ohka Kogyo Co., Ltd.) was spin-coated on the transparent substrate and the hard mask film pattern to form a resist film (FIG. 8C). Next, using a laser drawing apparatus, an effective region including the circuit pattern of the phase shift film was drawn so as to leave the resist film at the portion located at the outer peripheral edge part of the transparent substrate. Then, heat treatment (PEB) was performed at 110° C. for 20 minutes using a heat treatment apparatus. Next, spray development was performed for 200 seconds to form a resist pattern (FIG. 9A). Next, chlorine-based dry etching was performed on the hard mask film pattern under the above conditions using a chlorine-based gas containing oxygen gas to remove a hard mask film pattern (FIG. 9B). Next, the resist pattern was removed by washing with sulfuric acid hydrogen peroxide (FIG. 9C) to obtain a photomask.

Next, the resolution limit of the test pattern of the obtained photomask was evaluated using a visual inspection device. For all isolated patterns with different short side dimensions with the long side dimension of 140 nm and the short side dimension being changed by 2 nm from 20 nm to 100 nm, the pattern disappearance, the pattern collapse and the pattern shape defect were evaluated. An isolated pattern in which the visual inspection device detects any of the pattern disappearance, the pattern collapse, and the pattern shape defect was regarded as a defect, and the smallest short side dimension in which there was no isolated pattern in which a defect was detected was regarded as the resolution limit. The results are shown in Table 3.

As shown in Table 3, the phase shift mask blanks of Example 1, Example 2, Example 3, Example 4, and Example 5, which are the photomask blanks of the present embodiment, have the resolution limit of the line pattern reaching a fine line width, compared with the phase shift mask blanks of Comparative Example 1, Comparative Example 2, Comparative Example 3, and Comparative Example 4, and it was confirmed that the present embodiment was superior in resolution. The resolution of Example 1, Example 2, Example 3, Example 4, and Example 5 is better than that of Comparative Example 1 because the initial resist film thickness is thin. The resolution of Example 1, Example 2, Example 3, Example 4, and Example 5 is better than that of Comparative Example 2, Comparative Example 3, and Comparative Example 4. It is conceivable that this is because side etching is suppressed during the dry etching of the hard mask film, and the pattern shape is rectangular, so that the pattern disappearance does not occur.

TABLE 1

| | | Chromium | Oxygen | Nitrogen | Carbon | Thickness | Optical |
| | | Content (atomic %) | | | | (nm) | density |
| --- | --- | --- | --- | --- | --- | --- | --- |
| Example 1 | First layer | 33.0 | 52.0 | 15.0 | 0.0 | 5 | 1.8 |
| | Second layer | 34.9 | 37.8 | 16.6 | 10.6 | 28 | |
| | Third layer | 41.7 | 22.6 | 26.8 | 9.0 | 3 | |
| | Fourth layer | 41.6 | 29.4 | 14.9 | 14.1 | 15 | |
| Example 2 | First layer | 33.0 | 52.0 | 15.0 | 0.0 | 5 | 1.8 |
| | Second layer | 34.9 | 37.8 | 16.6 | 10.6 | 28 | |
| | Third layer | 41.7 | 22.6 | 26.8 | 9.0 | 3 | |
| | Fourth layer | 35.1 | 35.7 | 17.6 | 11.6 | 20 | |
| Example 3 | First layer | 33.0 | 52.0 | 15.0 | 0.0 | 5 | 1.8 |
| | Second layer | 34.9 | 37.8 | 16.6 | 10.6 | 28 | |
| | Third layer | 41.7 | 22.6 | 26.8 | 9.0 | 3 | |
| | Fourth layer | 36.0 | 34.9 | 16.3 | 12.9 | 17.5 | |
| Example 4 | First layer | 33.0 | 52.0 | 15.0 | 0.0 | 5 | 1.8 |
| | Second layer | 34.9 | 37.8 | 16.6 | 10.6 | 28 | |
| | Third layer | 41.7 | 22.6 | 26.8 | 9.0 | 3 | |
| | Fourth layer | 43.0 | 27.0 | 15.9 | 14.1 | 24 | |
| Example 5 | First layer | 33.0 | 52.0 | 15.0 | 0.0 | 5 | 1.8 |
| | Second layer | 34.9 | 37.8 | 16.6 | 10.6 | 28 | |
| | Third layer | 41.7 | 22.6 | 26.8 | 9.0 | 3 | |
| | Fourth layer | 34.0 | 36.0 | 15.9 | 14.1 | 34 | |
| Comparative Example 1 | First layer | 42.0 | 46.0 | 12.0 | 0.0 | 10 | 1.8 |
| | Second layer | 52.0 | 12.0 | 36.0 | 0.0 | 4 | |
| | Third layer | 37.0 | 55.0 | 8.0 | 0.0 | 20 | |
| Comparative Example 2 | First layer | 33.0 | 52.0 | 15.0 | 0.0 | 5 | 1.8 |
| | Second layer | 45.0 | 31.0 | 14.0 | 10.0 | 22 | |
| | Third layer | 41.7 | 22.6 | 26.8 | 9.0 | 3 | |
| | Fourth layer | 41.6 | 29.4 | 14.9 | 14.1 | 15 | |
| Comparative Example 3 | First layer | 33.0 | 52.0 | 15.0 | 0.0 | 5 | 1.8 |
| | Second layer | 34.9 | 37.8 | 16.6 | 10.6 | 28 | |
| | Third layer | 41.7 | 22.6 | 26.8 | 9.0 | 3 | |
| | Fourth layer | 32.0 | 30.0 | 28.0 | 10.0 | 26 | |
| Comparative Example 4 | First layer | 60.0 | 16.0 | 20.0 | 4.0 | 20 | 1.8 |

TABLE 2

| Photomask blank | Clear time [second] | Difference in clear time from Comparative Example 1 [second] | Residual resist film when 100% overetching is added [nm] (initial film thickness of 150 nm) | Resist loss amount when 100% overetching is added [nm] | Initial resist film thickness required to secure residual resist film of 35 nm after Cr dry etching [nm] | Difference in resist loss amount [nm] from Comparative Example 1 when 100% overetching is added [nm] |
|---|---|---|---|---|---|---|
| Example 1 | 160 | −50 | 60.1 | 89.9 | 124.9 | −28.1 |
| Example 2 | 158 | −52 | 61.2 | 88.8 | 123.8 | −29.2 |
| Example 3 | 161 | −49 | 59.5 | 90.5 | 125.5 | −27.5 |
| Example 4 | 168 | −42 | 55.6 | 94.4 | 129.4 | −23.6 |
| Example 5 | 153 | −57 | 64.0 | 86.0 | 121.0 | −32.0 |
| Comparative Example 1 | 210 | 0 | 32.0 | 118.0 | 153.0 | 0.0 |
| Comparative Example 2 | 186 | −24 | 45.5 | 104.5 | 139.5 | −13.5 |
| Comparative Example 3 | 150 | −60 | 65.7 | 84.3 | 119.3 | −33.7 |
| Comparative Example 4 | 168 | −42 | 55.6 | 94.4 | 129.4 | −23.6 |

TABLE 3

| Photomask blank | Resolution limit [nm] | Difference in resolution limit from Comparative Example 1 [nm] |
|---|---|---|
| Example 1 | 32 | −28 |
| Example 2 | 36 | −24 |
| Example 3 | 34 | −26 |
| Example 4 | 30 | −30 |
| Example 5 | 38 | −22 |
| Comparative Example 1 | 60 | 0 |
| Comparative Example 2 | 50 | −10 |
| Comparative Example 3 | 44 | −16 |
| Comparative Example 4 | 46 | −14 |

REFERENCE SIGNS LIST 1 substrate (transparent substrate)
21 film made of silicon-containing material (phase shift film)
21a pattern film made of silicon-containing material (phase shift film pattern)
22 reflective film
23 film (absorption film) made of tantalum-containing material
23a absorption film pattern
31 film made of chromium-containing material (hard mask film)
31a pattern of film made of chromium-containing material (hard mask film pattern)
31b pattern of film made of chromium-containing material (light-shielding film pattern)
311 first layer
312 second layer
313 third layer
314 fourth layer
4 resist film
41 resist pattern
5 effective region
511, 512 phase shift mask blank
513 phase shift mask
521, 522 reflective mask blank
523 reflective mask

What is claimed is:

1. A photomask blank comprising:
a substrate;
a film made of a chromium-containing material; and
a film to be processed that is provided between the film made of the chromium-containing material and the substrate, and that is to be processed by using a pattern of the film made of the chromium-containing material as an etching mask, wherein
the film made of the chromium-containing material has a first layer, a second layer, a third layer, and a fourth layer in order from a side away from the substrate,
each of the first layer, the second layer, the third layer, and the fourth layer contains three or more kinds of elements of chromium, oxygen, nitrogen, and carbon,
the first layer has a chromium content of 40 atomic % or less, an oxygen content of 38 atomic % or more, and a nitrogen content of 22 atomic % or less, and a thickness of 6 nm or less,
the second layer has a chromium content of 38 atomic % or less, an oxygen content of 30 atomic % or more, a nitrogen content of 18 atomic % or less, and a carbon content of 14 atomic % or less, and a film thickness of 22 nm or more and 32 nm or less,
the third layer has a chromium content of 50 atomic % or less, an oxygen content of 30 atomic % or less, and a nitrogen content of 20 atomic % or more, and a film thickness of 6 nm or less, and
the fourth layer has a chromium content of 44 atomic % or less, an oxygen content of 20 atomic % or more, a nitrogen content of 20 atomic % or less, and a carbon content of 16 atomic % or less, and a film thickness of 13 nm or more.

2. The photomask blank according to claim 1, wherein the film to be processed is a film made of a silicon-containing material.

3. The photomask blank according to claim 2, wherein
the film made of the chromium-containing material is a light-shielding film,
the film made of the silicon-containing material is a phase shift film, and
the photomask blank is a phase shift mask blank in which a combined optical density of the light-shielding film and the phase shift film with respect to exposure light is 3 or more.

4. The photomask blank according to claim 3, wherein the film made of the chromium-containing material has a film thickness of 39 nm or more and 94 nm or less.

5. The photomask blank according to claim 3, wherein the phase shift film has a phase difference of 175 degrees or more and 185 degrees or less with respect to the exposure light, a transmittance of 6% or more and 30% or less, and a film thickness of 60 nm or more and 85 nm or less.

6. A method of manufacturing a photomask having a circuit pattern of a film made of a silicon-containing material from the photomask blank according to claim 2, the method comprising steps of:
 (A) forming a resist film on a side, which is away from the substrate, of the film made of the chromium-containing material;
 (C) patterning the resist film to form a resist pattern;
 (D) patterning the film made of the chromium-containing material to form a pattern of the film made of the chromium-containing material by dry etching using an oxygen-containing chlorine-based gas with the resist pattern as an etching mask;
 (E) patterning a film made of a silicon-containing material to form a pattern of the film made of the silicon-containing material by dry etching using a fluorine-based gas with the pattern of the film made of the chromium-containing material as an etching mask; and
 (F) after step (E), leaving the film made of the chromium-containing material at a portion, located at an outer peripheral edge part of the substrate, where the circuit pattern is not formed, and removing the pattern of the film made of the chromium-containing material in other than the outer peripheral edge part by dry etching using an oxygen-containing chlorine-based gas.

7. The method of manufacturing according to claim 6, further comprising:
 after step (A) and before step (C),
 (B) removing the resist film using a mixture of sulfuric acid and hydrogen peroxide solution, and newly forming a resist film on a side, which is away from the substrate, of the film made of the chromium-containing material.

8. The photomask blank according to claim 1, wherein the film to be processed has a film made of a tantalum-containing material.

9. The photomask blank according to claim 8, wherein
 the film made of the tantalum-containing material is an absorption film for extreme ultraviolet region light,
 the film to be processed has a reflective film for the extreme ultraviolet region light provided between the absorption film and the substrate, and
 the photomask blank is a reflective mask blank.

10. The photomask blank according to claim 1, further comprising a resist film provided on a side, which is away from the substrate, of the film made of the chromium-containing material, the resist film having a film thickness of 50 nm or more and 200 nm or less.

11. A photomask comprising:
 a substrate; and
 a film to be processed provided on the substrate and having an effective region including a circuit pattern, wherein
 a film made of a chromium-containing material is provided on the film to be processed at an outer peripheral edge part located outside a peripheral edge of the effective region, and the film made of the chromium-containing material has a first layer, a second layer, a third layer, and a fourth layer in order from a side away from the substrate,
 each of the first layer, the second layer, the third layer, and the fourth layer contains three or more kinds of elements of chromium, oxygen, nitrogen, and carbon,
 the first layer has a chromium content of 40 atomic % or less, an oxygen content of 38 atomic % or more, and a nitrogen content of 22 atomic % or less, and a thickness of 6 nm or less,
 the second layer has a chromium content of 38 atomic % or less, an oxygen content of 30 atomic % or more, a nitrogen content of 18 atomic % or less, and a carbon content of 14 atomic % or less, and a film thickness of 22 nm or more and 32 nm or less,
 the third layer has a chromium content of 50 atomic % or less, an oxygen content of 30 atomic % or less, and a nitrogen content of 20 atomic % or more, and a film thickness of 6 nm or less, and
 the fourth layer has a chromium content of 44 atomic % or less, an oxygen content of 20 atomic % or more, a nitrogen content of 20 atomic % or less, and a carbon content of 16 atomic % or less, and a film thickness of 13 nm or more.

12. The photomask according to claim 11, wherein
 the film to be processed is a film made of a silicon-containing material,
 the film made of the chromium-containing material is a light-shielding film,
 the film made of the silicon-containing material is a phase shift film, and
 the photomask is a phase shift mask in which a combined optical density of the light-shielding film and the phase shift film with respect to exposure light is 3 or more.

13. The photomask according to claim 12, wherein the film made of the chromium-containing material has a film thickness of 39 nm or more and 94 nm or less.

14. The photomask according to claim 12, wherein the phase shift film has a phase difference of 175 degrees or more and 185 degrees or less with respect to the exposure light, a transmittance of 6% or more and 30% or less, and a film thickness of 60 nm or more and 85 nm or less.

* * * * *